(12) United States Patent
Kim

(10) Patent No.: US 12,369,331 B2
(45) Date of Patent: Jul. 22, 2025

(54) ELECTRONIC DEVICE AND METHOD FOR FABRICATING THE SAME

(71) Applicant: SK hynix Inc., Icheon (KR)

(72) Inventor: Hwang Yeon Kim, Icheon (KR)

(73) Assignee: SK hynix Inc., Icheon-si (KR)

( * ) Notice: Subject to any disclaimer, the term of this patent is extended or adjusted under 35 U.S.C. 154(b) by 800 days.

(21) Appl. No.: 17/524,510

(22) Filed: Nov. 11, 2021

(65) Prior Publication Data

US 2022/0375995 A1    Nov. 24, 2022

(30) Foreign Application Priority Data

May 21, 2021 (KR) .......................... 10-2021-0065415

(51) Int. Cl.
*H10B 63/00* (2023.01)
*H10N 70/00* (2023.01)

(52) U.S. Cl.
CPC ........... *H10B 63/80* (2023.02); *H10N 70/063* (2023.02)

(58) Field of Classification Search
CPC ........ H10B 63/80; H10B 61/10; H10N 70/63; H10N 70/826; G11C 11/161
See application file for complete search history.

(56) References Cited

U.S. PATENT DOCUMENTS

| 2011/0169136 A1 | 7/2011 | Pickett et al. | |
| 2020/0098988 A1* | 3/2020 | Kim | H10B 63/84 |
| 2022/0069212 A1* | 3/2022 | Takahashi | H10N 70/826 |

* cited by examiner

*Primary Examiner* — Mounir S Amer

(57) ABSTRACT

An electronic device comprising a semiconductor memory is provided. The semiconductor memory includes a substrate including a cell region and a peripheral circuit region, the cell region including a first cell region and a second cell region, the first cell region being disposed closer to the peripheral circuit region than the second cell region; second lines disposed over the first lines and extending in a second direction crossing the first direction; memory cells positioned at intersections between the first lines and the second lines in the cell region; a first insulating layer positioned between the first lines, between the second line, or both, in the first cell region; and a second insulating layer positioned between the first lines and between the second lines in the second cell region. A dielectric constant of the first insulating layer is smaller than that of the second insulating layer.

16 Claims, 26 Drawing Sheets

ELECTRONIC DEVICE AND METHOD FOR FABRICATING THE SAME

CROSS-REFERENCE TO RELATED APPLICATION

This application claims priority under 35 U.S.C. § 119 to Korean Patent Application No. 10-2021-0065415 filed on May 21, 2021, which is incorporated herein by reference in its entirety.

BACKGROUND

1. Technical Field

This patent document relates to memory circuits or devices and their applications in electronic devices or systems.

2. Related Art

Recently, as electronic appliances trend toward miniaturization, low power consumption, high performance, multi-functionality, and so on, semiconductor devices capable of storing information in various electronic appliances such as a computer, a portable communication device, and so on have been demanded in the art, and research has been conducted for the semiconductor devices. Such semiconductor devices can store data using a characteristic of switching between different resistance states according to an applied voltage or current, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes various embodiments of an electronic device capable of improving operating characteristics of a semiconductor memory and simplifying processes.

In an embodiment, an electronic device includes a semiconductor memory, which includes: a substrate including a cell region and a peripheral circuit region, the cell region including a first cell region and a second cell region, the first cell region being disposed closer to the peripheral circuit region than the second cell region; a plurality of first lines disposed over the substrate and each extending in a first direction; a plurality of second lines disposed over the first lines and each extending in a second direction crossing the first direction; a plurality of memory cells positioned at intersections between the first lines and the second lines in the cell region; a first insulating layer positioned between the plurality of first lines, between the plurality of second line, or both, in the first cell region; and a second insulating layer positioned between the plurality of first lines and between the plurality of second lines in the second cell region, wherein a dielectric constant of the first insulating layer is smaller than a dielectric constant of the second insulating layer.

In another embodiment, an electronic device includes a semiconductor memory, which includes: a substrate including a cell region and a peripheral circuit region, the cell region including a first cell region and a second cell region, the first cell region being disposed closer to the peripheral circuit region than the second cell region; a plurality of first lines disposed over the substrate and each extending in a first direction; a plurality of second lines disposed over the first lines and each extending in a second direction crossing the first direction; a plurality of memory cells positioned at intersections between the first lines and the second lines in the cell region; a first insulating layer positioned between the plurality of first lines, between the plurality of second line, or both, in the first cell region; and a second insulating layer positioned between the plurality of first lines and between the plurality of second lines in the second cell region, wherein when the first insulating layer is positioned between the plurality of first lines, a first capacitance generated by first adjacent portions of the plurality of first lines in the first cell region and a first portion of the first insulating layer is smaller than a second capacitance generated by second adjacent portions of the plurality of first lines in the second cell region and a first portion of the second insulating layer, and when the first insulating layer is positioned between the plurality of second lines, a third capacitance generated by first adjacent portions of the plurality of second lines in the first cell region and a second portion of the first insulating layer is smaller than a fourth capacitance generated by second adjacent portions of the plurality of second lines in the second cell region and a second portion of the second insulating layer.

In an embodiment, a method for fabricating an electronic device comprising a semiconductor memory, which includes: providing a substrate that includes a peripheral circuit region and a cell region, wherein the cell region includes a first cell region and a second cell region, the first cell region being disposed closer to the peripheral circuit region than the second cell region; forming a plurality of stacked structures each extending in a first direction over the substrate, each of the stacked structures including a first line and an initial memory cell disposed over the first line; forming a first insulating material layer filled between the stacked structures; replacing one or more portions of the first insulating material layer in the first cell region with a second insulating material layer that has a lower dielectric constant than a dielectric constant of the first insulating material layer; forming a plurality of second lines each extending in a second direction over the stacked structures, the first insulating material layer, and the second insulating material layer; and forming a plurality of memory cells by etching the initial memory cells exposed by the second lines.

In an embodiment, a method for fabricating an electronic device comprising a semiconductor memory, which includes: providing a substrate that includes a peripheral circuit region and a cell region, wherein the cell region includes a first cell region and a second cell region, the first cell region being disposed closer to the peripheral circuit region than the second cell region; forming a plurality of stacked structures each extending in a first direction over the substrate, each of the stacked structures including a first line and an initial memory cell disposed over the first line; forming a first insulating material layer filled between the stacked structures; forming a plurality of second lines each extending in a second direction over the stacked structures and the first insulating material layer; forming a plurality of memory cells by etching the initial memory cells exposed by the second lines; forming a third insulating material layer filled between the second lines and between the memory cells in the first direction; and replacing one or more portions of the third insulating material layer in the first cell region with a fourth insulating material layer that has a lower dielectric constant than a dielectric constant of the third insulating material layer.

DETAILED DESCRIPTION

Figure 1:
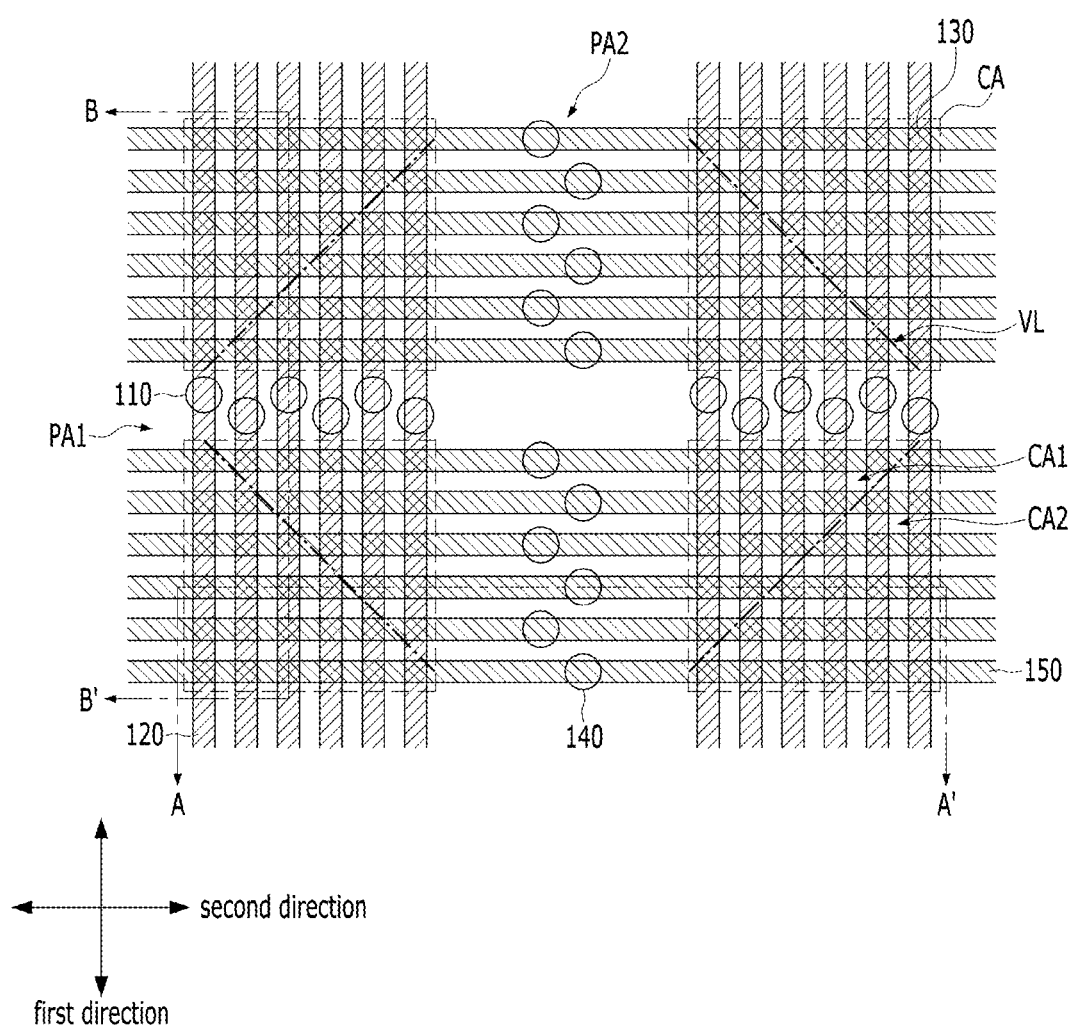
FIG. 1 is a plan view illustrating a memory device according to an embodiment of the present disclosure.

Hereinafter, various embodiments of the disclosure will be described in detail with reference to the accompanying drawings.

The drawings are not necessarily drawn to scale. In some instances, proportions of at least some structures in the drawings may have been exaggerated in order to clearly illustrate certain features of the described embodiments. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure might not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Figure 2A:
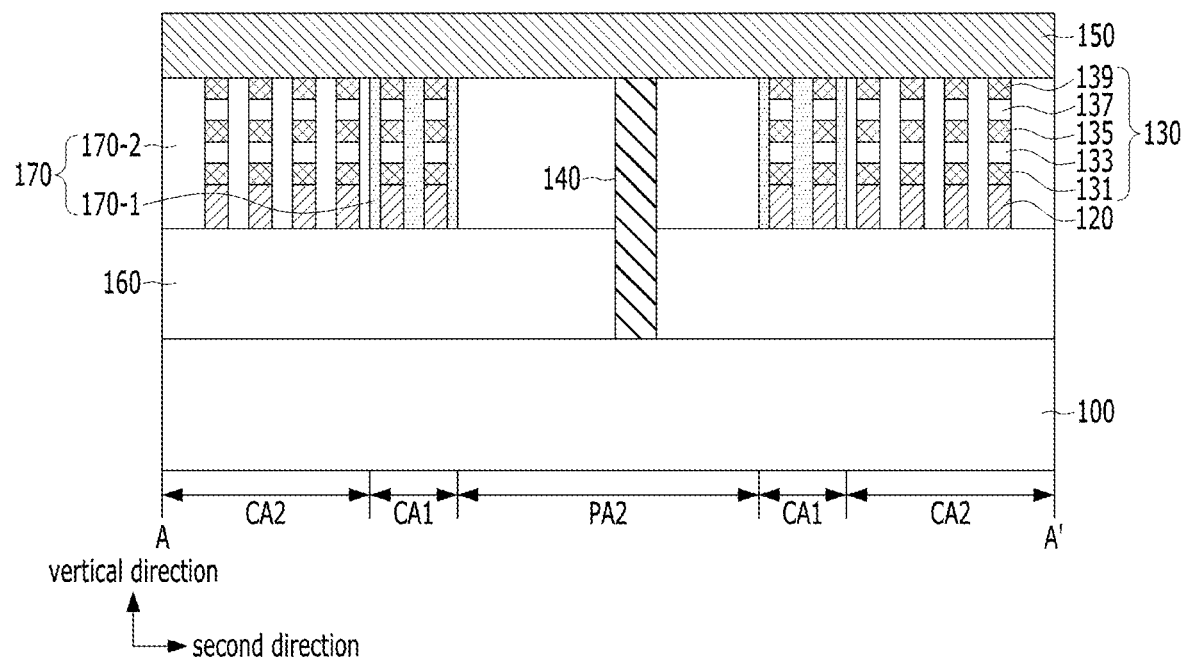
FIG. 2A is a cross-sectional view taken along a line A-A' of FIG. 1.
Figure 2B:
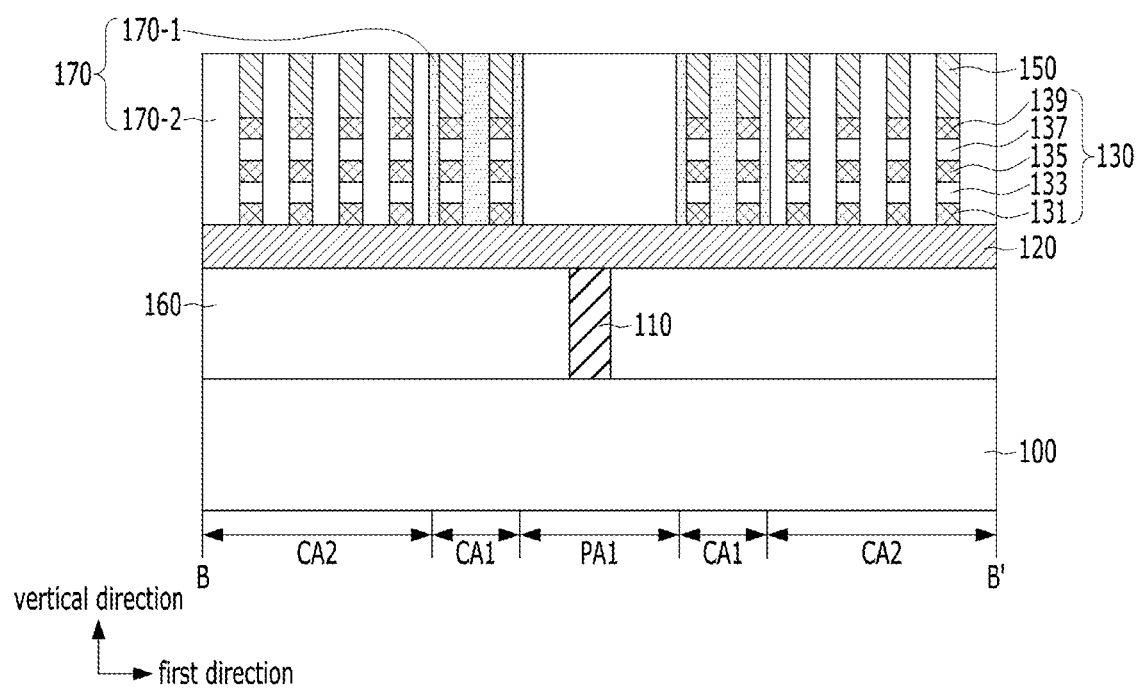
FIG. 2B is a cross-sectional view taken along a line B-B' of FIG. 1.

FIG. 1 is a plan view illustrating a memory device according to an embodiment of the present disclosure, FIG. 2A is a cross-sectional view taken along a line A-A' of FIG. 1, and FIG. 2B is a cross-sectional view taken along a line B-B' of FIG. 1.

Referring to FIGS. 1, 2A, and 2B, a memory device of the present embodiment may include a substrate 100, first lines 120 disposed over the substrate 100 and extending in a first direction, second lines 150 disposed over the first lines 120 and extending in a second direction that crosses the first direction, and a memory cell 130 positioned at each of intersections between the first lines 120 and the second lines 150.

The substrate 100 may include a semiconductor material such as silicon. In addition, the substrate 100 may include a cell region CA and peripheral circuit regions PA1 and PA2. The cell region CA may be a region in which the memory cells 130 are disposed, and the peripheral circuit regions PA1 and PA2 may be regions in which driving circuits (not shown) for driving the memory cells 130 are disposed. While the memory cells 130 are disposed over the substrate 100 of the cell region CA, the driving circuits may be formed in the substrate 100 of the peripheral circuit regions PA1 and PA2.

In the embodiment of FIG. 1, in a plan view, the cell region CA may have a rectangular shape, and four cell regions CA may be arranged to be spaced apart from each other in a 2*2 shape along the first and second directions. In addition, in a plan view, the peripheral circuit regions PA1 and PA2 may be positioned between these cell regions CA, and may have a cross shape or a lattice shape. However, embodiments of the present disclosure are not limited thereto, and the number and arrangement of the cell regions CA and the peripheral circuit regions PA1 and PA2 may be variously modified. For convenience of description, among the peripheral circuit regions PA1 and PA2, a region extending in the second direction while being positioned between the two cell regions CA arranged in the first direction will be referred to as a first peripheral circuit region PA1, and a region extending in the first direction while being positioned between the two cell regions CA arranged in the second direction will be referred to as a second peripheral circuit region PA2.

Meanwhile, the cell region CA may include a first cell region CA1 relatively close to the peripheral circuit regions PA1 and PA2, and a second cell region CA2 relatively far from the peripheral circuit regions PA1 and PA2. Specifically, the first cell region CA1 may be disposed closer to one or both of the peripheral circuit regions PA1 and PA2 than the second cell region CA2. In an embodiment, the first cell region CA1 may include a first plurality of memory cells, each of which is spaced apart from a corresponding one of first contact plugs 110 in the first direction by a first distance and from a corresponding one of second contact plugs 140 in the second direction by a second distance, such that the sum of the first distance and the second distance is equal to or less than a given distance. In such an embodiment, the second cell region CA2 includes a second plurality of memory cells, each of which is spaced apart from a corresponding one of first contact plugs 110 in the first direction by a third distance and from a corresponding one of second contact plugs 140 in the second direction by a fourth distance, such that the sum of the third distance and the fourth distance exceeds the given distance. Accordingly, an electrical path between the memory cell 130 of the first cell region CA1 and the driving circuit of the peripheral circuit regions PA1 and PA2 may be shorter than an electrical path between the memory cell 130 of the second cell region CA2 and the driving circuit of the peripheral circuit regions PA1 and PA2. In an embodiment, a virtual boundary line VL separating the first cell region CA1 and the second cell region CA2 may extend in a diagonal direction crossing the first direction and the second direction. For example, the first cell region CA1 may include a first plurality of memory cells, each of which is spaced apart from a first boundary between the peripheral circuit region PA1 and the first cell region CA1 in the first direction by a first distance and from a second boundary between the peripheral circuit region PA2 and the first cell region CA1 in the second direction by a second distance, such that the sum of the first distance and the second distance is equal to or less than a given distance. The second cell region CA2 may include a second plurality of memory cells, each of which is spaced apart from the first boundary in the first direction by a third distance and from the second boundary in the second direction by a fourth distance, such that the sum of the third distance and the fourth distance exceeds the given distance. However, embodiments of the present disclosure are not limited thereto, and the boundary line VL may be variously determined in consideration of the distance between the memory cell 130 and the peripheral circuit regions PA1 and PA2.

The first lines 120 may extend in the first direction across the cell region CA and the first peripheral circuit region PA1. The first lines 120 may function as word lines or bit lines. The first lines 120 may be electrically connected to a portion of the substrate 100, for example, a driving circuit formed in the substrate 100 in the first peripheral circuit region PA1, through first contact plugs 110 which are disposed in the first peripheral circuit region PA1 and are respectively connected to the first lines 110 thereunder. The first contact plugs 110 may be formed to penetrate a first interlayer insulating layer 160 between the first lines 120 and the substrate 100. The first interlayer insulating layer 160 may include various insulating materials such as silicon oxide, silicon nitride, or a combination thereof. The first lines 120 and the first contact plugs 110 may include various conductive materials, for example, a metal such as platinum (Pt), tungsten (W), aluminum (Al), copper (Cu), or tantalum (Ta), a metal nitride such as titanium nitride (TiN) or tantalum nitride (TaN), or a combination thereof. In the embodiment of FIGS. 1, 2A, and 2B, the plurality of first lines 120 and the plurality of first contact plugs 110 may be connected in one-to-one correspondence. In addition, the first contact plugs 110 may be arranged in a zigzag shape along the second direction in a plan view. This is to secure a gap between adjacent first contact plugs 110 in the second direction. However, embodiments of the present disclosure are not limited thereto, and the number and arrangement of the first lines 120 and the first contact plugs 110 may be variously modified.

The second lines 150 may extend in the second direction across the cell region CA and the second peripheral circuit region PA2. When the first lines 120 function as word lines, the second lines 150 may function as bit lines. Alternatively, when the first lines 120 function as bit lines, the second lines 150 may function as word lines. The second lines 150 may be electrically connected to a portion of the substrate 100, for example, a driving circuit formed in the substrate 100 in the second peripheral circuit region PA2, through second contact plugs 140 which are disposed in the second peripheral circuit region PA2 and are respectively connected to the second lines 150 thereunder. The second contact plugs 140 may be formed to penetrate the first interlayer insulating layer 160 and a second interlayer insulating layer 170 between the second lines 150 and the substrate 100. The second interlayer insulating layer 170 may include various insulating materials such as silicon oxide, silicon nitride, or a combination thereof. The second lines 150 and the second contact plugs 140 may include various conductive materials, for example, a metal such as platinum (Pt), tungsten (W), aluminum (Al), copper (Cu), or tantalum (Ta), a metal nitride such as titanium nitride (TiN) or tantalum nitride (TaN), or a combination thereof. In the embodiment of FIGS. 1, 2A, and 2B, the plurality of second lines 150 and the plurality of second contact plugs 140 may be connected in one-to-one correspondence. In addition, the second contact plugs 140 may be arranged in a zigzag shape along the first direction in a plan view. This is to secure a gap between adjacent second contact plugs 140 in the first direction. However, embodiments of the present disclosure are not limited thereto, and the number and arrangement of the second lines 150 and the second contact plugs 140 may be variously modified.

In the embodiment of FIGS. 1, 2A, and 2B, the second interlayer insulating layer 170 may include a first insulating layer 170-1 of the first cell region CA1 and a second insulating layer 170-2 of the second cell region CA2. The first insulating layer 170-1 may cover a side surface of the first line 120, a side surface of the memory cell 130, and a side surface of the second line 150 in the first cell region CA1. Accordingly, the first insulating layer 170-1 may be interposed between adjacent first lines 120, between adjacent memory cells 130, and between adjacent second lines 150 in the first cell region CA1. Also, the second insulating layer 170-2 may cover a side surface of the first line 120, a side surface of the memory cell 130, and a side surface of the second line 150 in the second cell region CA2. Accordingly, the second insulating layer 170-2 may be interposed between adjacent first lines 120, between adjacent memory cells 130, and between adjacent second lines 150 in the second cell region CA2.

Here, the first insulating layer 170-1 may include an insulating material having a lower dielectric constant k than the second insulating layer 170-2. As an example, the first insulating layer 170-1 may include a low-k material having a dielectric constant lower than a dielectric constant of standard silicon oxide ($SiO_2$). The term "standard silicon oxide" used in the specification may refer to silicon oxide (e.g., silicon dioxide) formed by using various conventional processes in the art of semiconductor fabrication. The dielectric constant of the low-k material may be less than 3.9, or even less than 2.7.

Furthermore, as an example, elements constituting the first insulating layer 170-1 may be the same as elements constituting the second insulating layer 170-2. For example, when the second insulating layer 170-2 includes standard silicon oxide, the first insulating layer 170-1 may also include silicon oxide. The k value of the silicon oxide for forming the first insulating layer 170-1 may be lower than the k value of the standard silicon oxide for forming the second insulating layer 170-2 by heat treatment. This will be described later in the process of describing a method for fabricating a memory device.

Alternatively, as another example, elements constituting the first insulating layer 170-1 may be different from elements constituting the second insulating layer 170-2. For example, when the second insulating layer 170-2 includes standard silicon oxide, the first insulating layer 170-1 may include SiCOH, hydrogen silsesquioxane (HSQ), methyl silsesquioxane (MSQ), SiCH, SiCNH, or a combination thereof.

The memory cells 130 may be arranged in the cell region CA by being located at the intersections between the first lines 120 and the second lines 150. The memory cell 130 may store different data according to a voltage or current applied to the first line 120 and the second line 150. As an example, the memory cell 130 may include a variable resistance element that stores different data by switching between different resistance states according to a voltage or current applied to the first line 120 and the second line 150. Further, as an example, the memory cell 130 may include a multi-layered structure including a lower electrode layer 131, a selection element layer 133, an intermediate electrode layer 135, a variable resistance layer 137, and an upper electrode layer 139.

The lower electrode layer 131 and the upper electrode layer 139 may be positioned at lower and upper ends of the memory cell 130, respectively, and may function to transmit a voltage or current required for the operation of the memory cell 130. The intermediate electrode layer 135 may function to electrically connect the selection element layer 133 and the variable resistance layer 137 while physically separating them. The lower electrode layer 131, the intermediate electrode layer 135, or the upper electrode layer 139 may include various conductive materials, for example, a metal such as platinum (Pt), tungsten (W), aluminum (Al), copper (Cu), or tantalum (Ta), a metal nitride such as titanium nitride (TiN) or tantalum nitride (TaN), or a combination thereof. Alternatively, the lower electrode layer 131, the intermediate electrode layer 135, or the upper electrode layer 139 may include a carbon electrode.

The selection element layer 133 may function to substantially prevent current leakage that may occur between the memory cells 130 sharing the first line 120 or the second line 150. To this end, the selection element layer 133 may have a threshold switching characteristic, that is, a characteristic for substantially blocking or limiting current when a magnitude of an applied voltage is less than a predetermined threshold value and for allowing current to abruptly increase when the magnitude of the applied voltage is greater than the threshold value. The threshold value may be referred to as a threshold voltage, and selection element layer 133 may be implemented in a turn-on state or a turn-off state based on the threshold voltage. The selection element layer 133 may include a diode, an OTS (Ovonic Threshold Switching) material such as a chalcogenide material, an MIEC (Mixed Ionic Electronic Conducting) material such as a metal containing chalcogenide material, an MIT (Metal Insulator Transition) material such as $NbO_2$, $VO_2$, or the like, or a tunneling insulating material having a relatively wide band gap such as $SiO_2$, $Al_2O_3$, or the like.

The variable resistance layer 137 may be a part that stores data in the memory cell 130. To this end, the variable resistance layer 137 may have a variable resistance characteristic of switching between different resistance states according to an applied voltage. The variable resistance layer 137 may have a single-layered structure or a multi-layered structure including at least one of materials used for an RRAM, a PRAM, an MRAM, an FRAM, or the like, that is, a metal oxide such as a perovskite-based oxide, a transition metal oxide, or the like, a phase change material such as a chalcogenide-based material, a ferromagnetic material, a ferroelectric material, or the like.

However, embodiments of the present disclosure are not limited to the memory cell 130 having the layered-structure. When the memory cell 130 is a variable resistance device, as long as it includes the variable resistance layer 137 essential for data storage, the stacking order of the layers included in the memory cell 130 may be changed or at least one of the stacked layers may be omitted. As an example, at least one of the lower electrode layer 131, the selection element layer 133, the intermediate electrode layer 135, and the upper electrode layer 139 may be omitted. Alternatively, as an example, the positions of the selection element layer 133 and the variable resistance layer 137 may be reversed. Alternatively, as an example, one or more layers (not shown) may be added to the memory cell 130 to improve fabricating processes or characteristics of the memory cell 130.

The effects of the memory device described above will be described in comparison with a comparative example as follows.

In a memory device of the comparative example, an interlayer insulating layer in which memory cells and their upper and lower lines are buried may be formed of a single insulating material regardless of the distance between the memory cells and a peripheral circuit region. In this comparative example, in order to drive the memory cell relatively far from the peripheral circuit region, it may be necessary to lower the resistance of the upper and lower lines or to supply a large amount of current through the upper and lower lines. However, there is a limit to lowering the resistance of the upper and lower lines. In addition, when a large amount of current is supplied through the upper and lower lines, an excessive overshooting current or spike current may flow into the memory cell relatively close to the peripheral circuit region, resulting in an operation failure of the memory cell.

However, as in the embodiment of FIGS. 1, 2A, and 2B, when the first insulating layer 170-1 of the first cell region CA1 has a lower dielectric constant than the second insulating layer 170-2 of the second cell region CA2, the issues of the comparative example may be solved. Specifically, when the first insulating layer 170-1 having a low dielectric constant is interposed between the adjacent first lines 120 in the first cell region CA1, a capacitance generated by the first lines 120 and the first insulating layer 170-1 may decrease. For example, a capacitance defined by adjacent first lines 120 and a portion of the first insulating layer 170-1 between the adjacent first lines 120 may be relatively small compared to that in the comparative example, thereby reducing a magnitude of an overshoot or spike current flowing through a memory cell relatively close to the peripheral circuit region to substantially prevent an operation failure of the memory cell. On the other hand, because the second insulating layer 170-2 having a higher dielectric constant than a dielectric constant of the first insulating layer 170-1 is interposed between the adjacent first lines 120 in the second cell region CA2, a capacitance generated by the first lines 120 and the second insulating layer 170-2 may be increased compared to the first cell region CA1. Similarly, when the first insulating layer 170-1 having a low dielectric constant is interposed between the adjacent second lines 150 in the first cell region CA1, a capacitance generated by the second lines 150 and the first insulating layer 170-1 may decrease. For example, a capacitance defined by adjacent second lines 150 and a portion of the first insulating layer 170-1 between the adjacent second lines 150 may be relatively small compared to that in the comparative example. On the other hand, because the second insulating layer 170-2 having a higher dielectric constant than a dielectric constant of the first insulating layer 170-1 is interposed between the adjacent second lines 150 in the second cell region CA2, a capacitance generated by the second lines 150 and the second insulating layer 170-2 may be increased compared to the first cell region CA1. A decrease in the capacitance due to a decrease in the dielectric constant has been confirmed experimentally, which will be described below with reference to FIG. 3A.

Figure 3A:
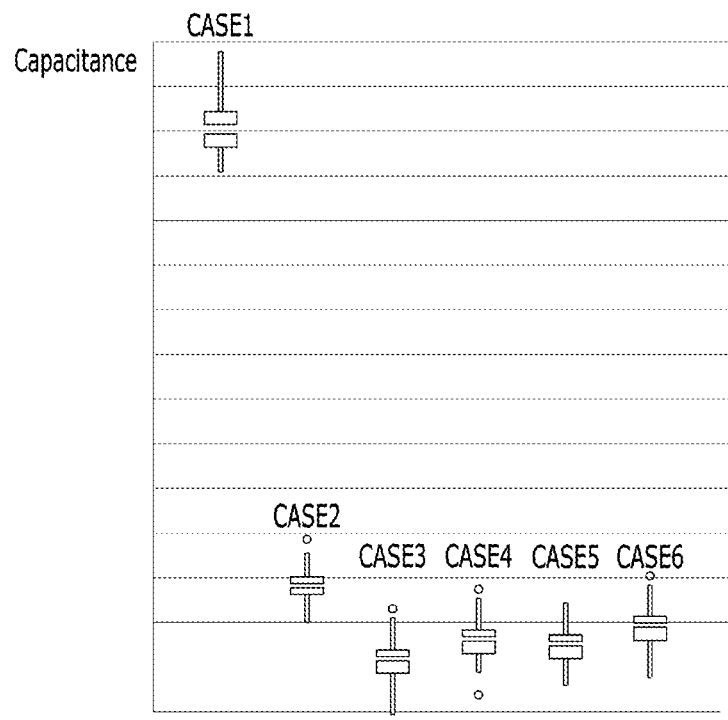
FIG. 3A is a diagram showing that a capacitance generated by lines and an insulating material therebetween is changed depending on a dielectric constant of the insulating material.

FIG. 3A is a diagram showing that a capacitance generated by lines and an insulating material therebetween is changed depending on a dielectric constant of the insulating material.

Referring to FIG. 3A, a first case CASE1 shows a capacitance when the insulating material is standard silicon oxide, and the second to sixth cases CASE2 to CASE6 show capacitances when various low-k materials are used as the insulating material. As a result, it may be seen that when the dielectric constant of the insulating material decreases, the capacitance also decreases.

As described above, when the capacitance in the first cell region CA1 decreases, the current supplied to the memory cell 130 in the first cell region CA1 may be limited. On the other hand, the current supplied to the memory cell 130 of the second cell region CA2 may be greater than that of the first cell region CA1. The current limitation by the capacitance reduction has been confirmed experimentally, and this will be described with reference to FIG. 3B.

Figure 3B:
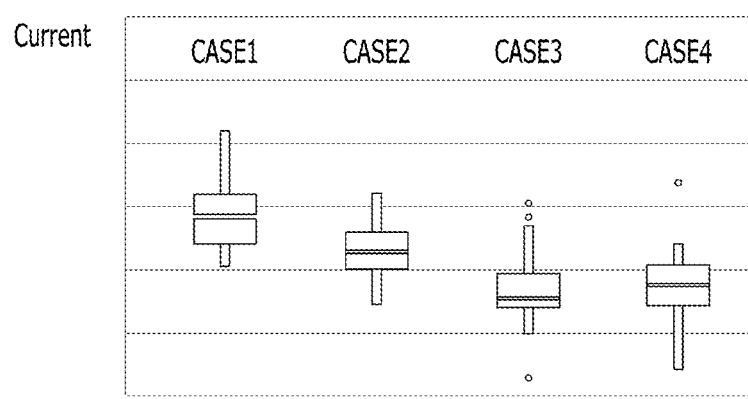
FIG. 3B is a diagram showing a current supplied to a memory cell according to a capacitance generated by lines and an insulating material therebetween.

FIG. 3B is a diagram showing a current supplied to a memory cell according to a capacitance generated by lines and an insulating material therebetween. For example, FIG. 3B shows distributions of magnitudes of a current supplied to a memory cell in a cell region (e.g., the first cell region CA1 in FIG. 1) relatively close to a peripheral region according to a capacitance defined by adjacent lines and an insulating material between the adjacent lines.

Referring to FIG. 3B, a first case CASE1 shows a case in which the insulating material is standard silicon oxide, and second to fourth cases CASE2 to CASE4 shows a case in which various low-k materials are used as the insulating material. Accordingly, it may be seen that a supplied current is large in the first case CASE1 having a relatively large capacitance, and a supplied current is small in the second to fourth cases CASE2 to CASE4 having relatively small capacitances.

As a result, while a sufficient current is supplied to the memory cell 130 of the second cell region CA2, a phenomenon in which the memory cell 130 of the first cell region CA1 fails due to an excessive current flowing into the memory cell 130 of the first cell region CA1 may be reduced/prevented. Accordingly, the operating characteristics of the memory device may be improved. The reduction in fail of the memory cell 130 according to the capacitance has been confirmed experimentally, and this will be described below with reference to FIG. 3C.

Figure 3C:
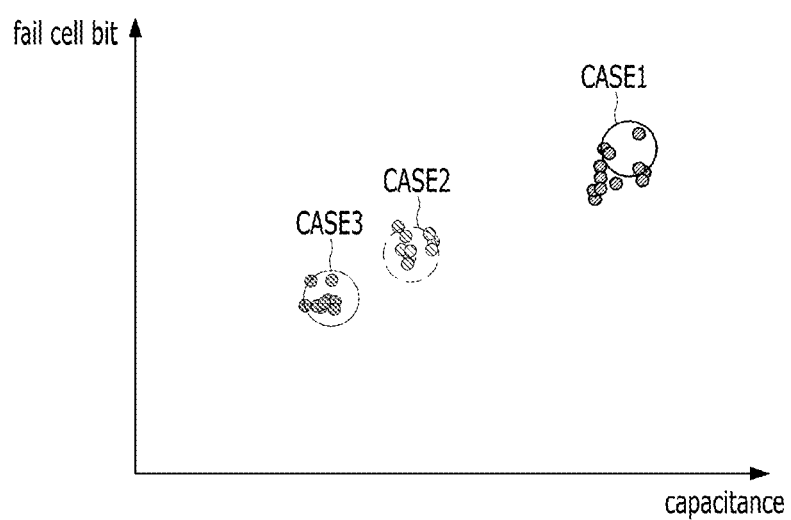
FIG. 3C is a diagram showing fail cell bits according to a capacitance generated by lines and an insulating material therebetween.

FIG. 3C is a diagram showing fail cell bits according to a capacitance generated by lines and an insulating material therebetween.

Referring to FIG. 3C, a first case CASE1 shows a case in which the capacitance is the largest and the fail cell bits are also the largest. A second case CASE2 is a case in which the capacitance is decreased compared to the first case CASE1 and shows a case in which the fail cell bits are also decreased. A third case CASE3 shows a case in which the capacitance is the smallest and the fail cell bits are also the smallest. As a result, it may be seen that the fail cell bits increase in proportion to the capacitance. Since the capacitance is reduced in an embodiment of the present Application compared to that in a comparative example, the operating characteristics of a memory device according to such an embodiment of the present Application may be improved compared to those of a memory device of the comparative example.

FIGS. 4A to 11B are cross-sectional views illustrating an example of a method for fabricating the memory device of FIGS. 1, 2A, and 2B. FIGS. 4A, 5A, 6A, 7A, 8A, 9A, 10A, and 11A are shown based on a cross section taken along the line A-A' of FIG. 1, and FIGS. 4B, 5B, 6B, 7B, 8B, 9B, 10B, and 11B are shown based on another cross section taken along the line B-B' of FIG. 1.

Figure 4A:
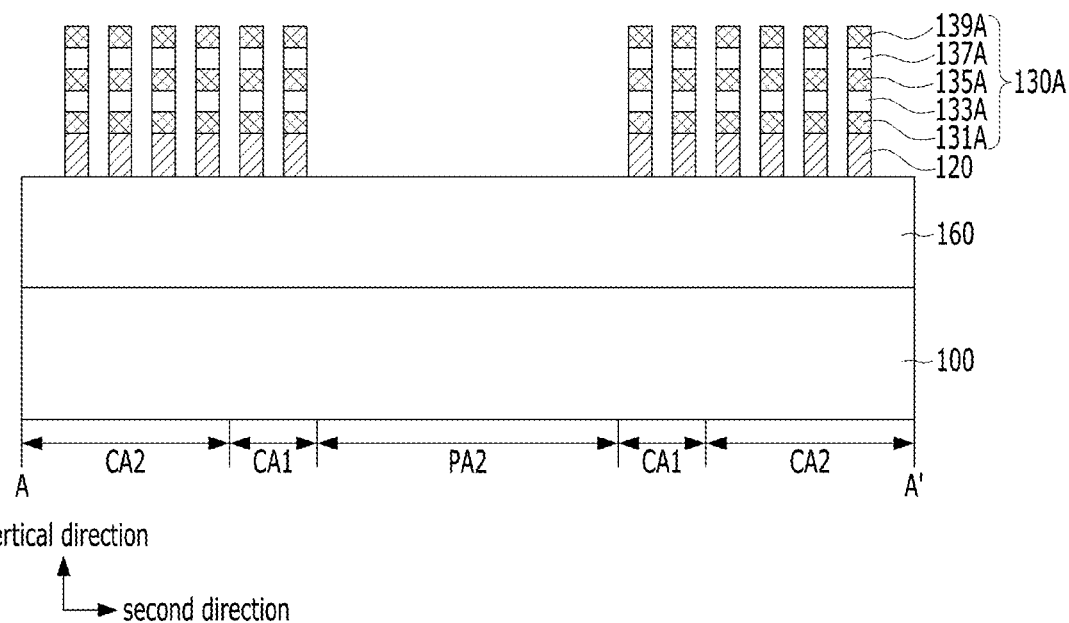
FIGS. 4A, 4B, 5A, 5B, 6A, 6B, 7A, 7B, 8A, 8B, 9A, 9B, 10A, 10B, 11A, and 11B are cross-sectional views illustrating an example of a method for fabricating the memory device of FIGS. 1, 2A, and 2B.
Figure 4B:
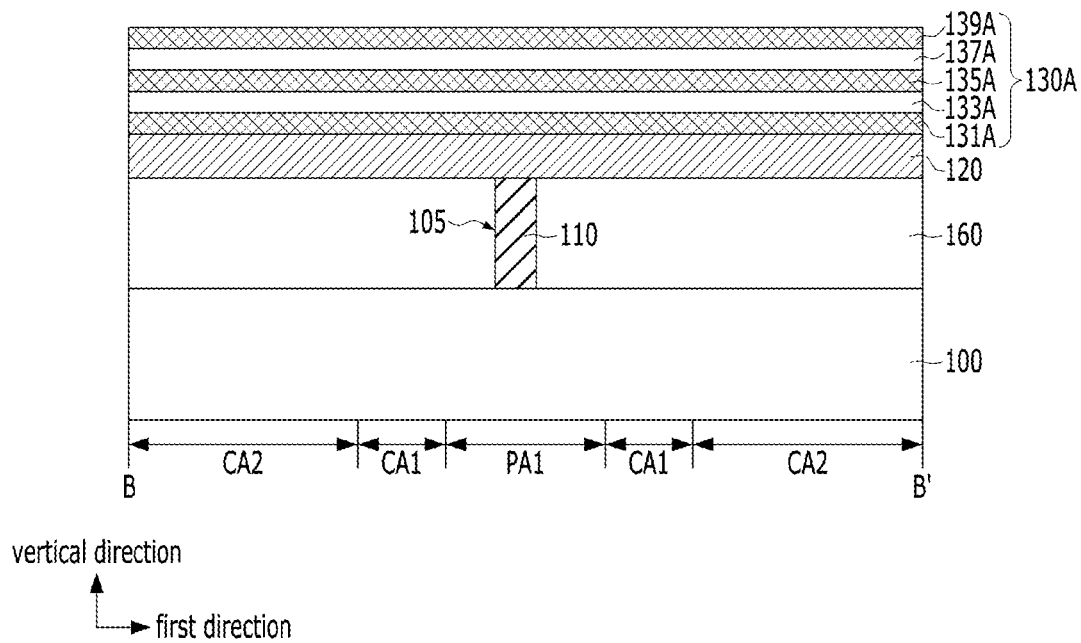

Referring to FIGS. 4A and 4B, a first interlayer insulating layer 160 may be formed over a substrate 100 including a first cell region CA1, a second cell region CA2, a first peripheral circuit region PA1, and a second peripheral circuit region PA2.

Subsequently, a first contact hole 105 exposing a part of the substrate 100 may be formed by selectively etching the first interlayer insulating layer 160 of the first peripheral circuit region PA1. Then, a first contact plug 110 may be formed by depositing a conductive material having a sufficient thickness to fill the first contact hole 105, and performing a planarization process, such as CMP (Chemical Mechanical Polishing), until an upper surface of the first interlayer insulating layer 160 is exposed.

Subsequently, a stacked structure of a first line 120 and an initial memory cell 130A may be formed over the first interlayer insulating layer 160 in which the first contact plug 110 is formed. A plurality of stacked structures may be formed. The stacked structure of the first line 120 and the initial memory cell 130A may be formed by depositing a conductive layer for forming the first line 120 and material layers for forming the initial memory cell 130A, and etching the conductive layer and the material layers using a mask pattern (not shown) having a line shape extending in a first direction as an etching barrier. Accordingly, the first line 120 may have a line shape extending in the first direction while overlapping and connecting with the first contact plug 110, and the initial memory cell 130A may have a line shape extending in the first direction while overlapping the first line 120. The initial memory cell 130A may include a stacked structure of an initial lower electrode layer 131A, an initial selection element layer 133A, an initial intermediate electrode layer 135A, an initial variable resistance layer 137A, and an initial upper electrode layer 139A.

Figure 5A:
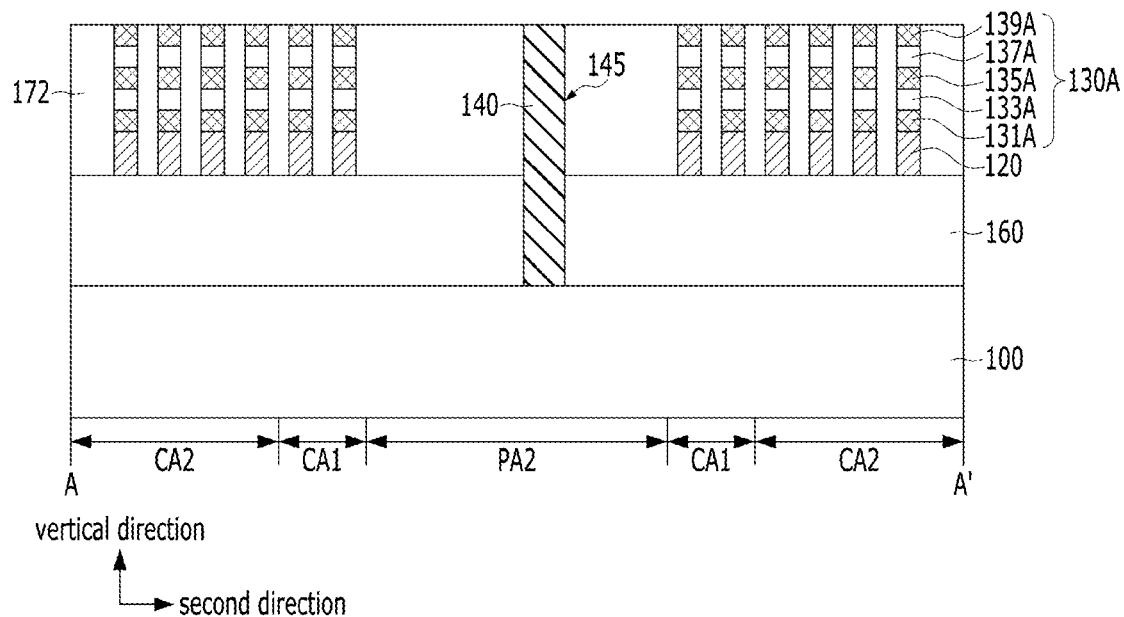
Figure 5B:
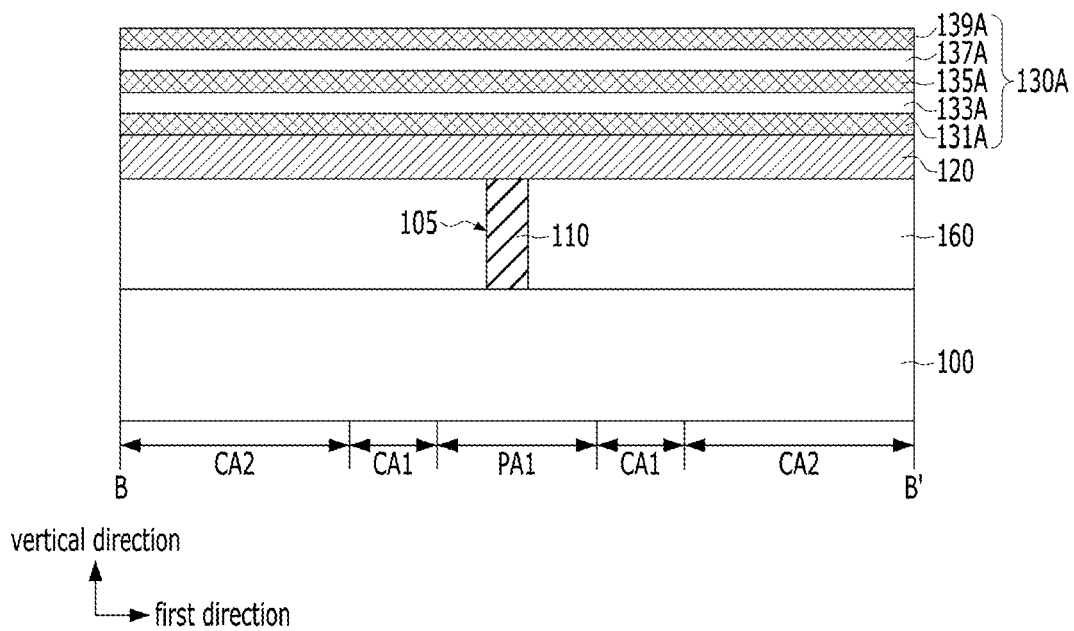

Referring to FIGS. 5A and 5B, a first insulating material layer 172 may be formed over the first interlayer insulating layer 160 to fill spaces between the stacked structures of the first lines 120 and the initial memory cells 130A. The first insulating material layer 172 may be formed by depositing an insulating material having a thickness sufficient to cover the initial memory cell 130A, and performing a planarization process until an upper surface of the initial memory cell 130A is exposed. The first insulating material layer 172 may be formed by a spin on coating (SOC) method, and may include standard silicon oxide. However, embodiments of the present disclosure are not limited thereto, and various deposition methods and insulating materials may be used when forming the first insulating material layer 172. Here, the first insulating material layer 172 may include a material whose k value decreases during heat treatment.

Subsequently, a second contact hole 145 exposing a part of the substrate 100 may be formed by selectively etching the first insulating material layer 172 and the first interlayer insulating layer 160 in the second peripheral circuit region PA2. Then, a second contact plug 140 that is filled in the second contact hole 145 may be formed.

Figure 6A:
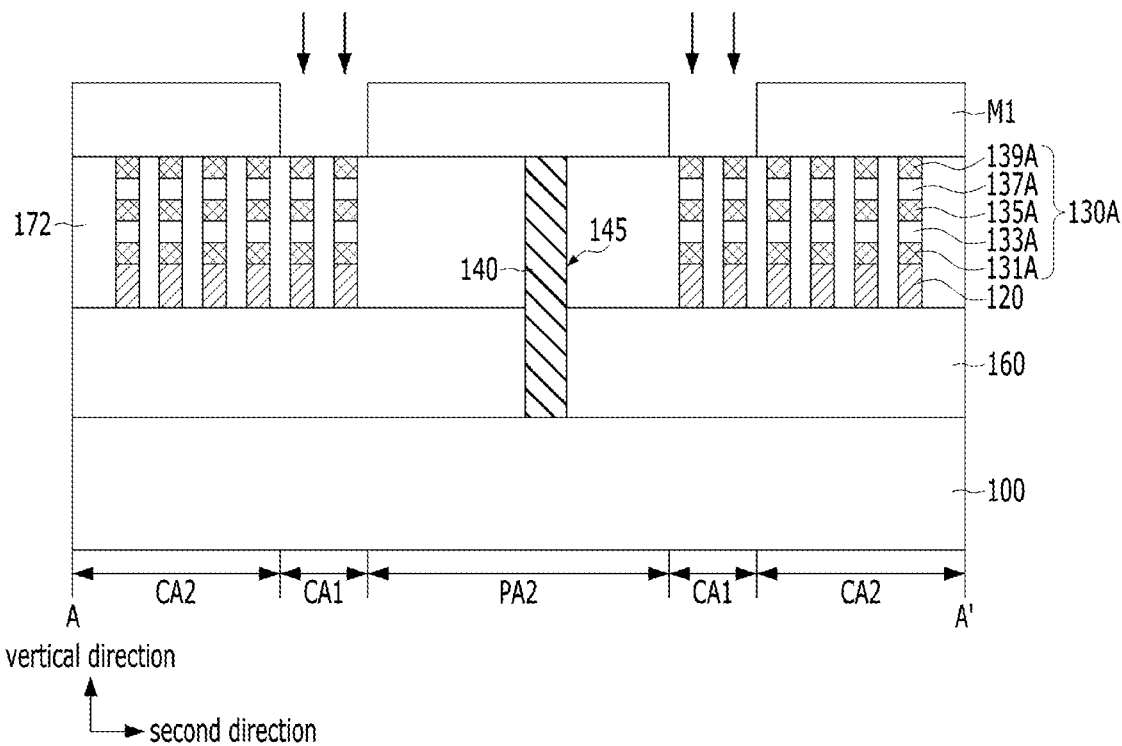
Figure 6B:
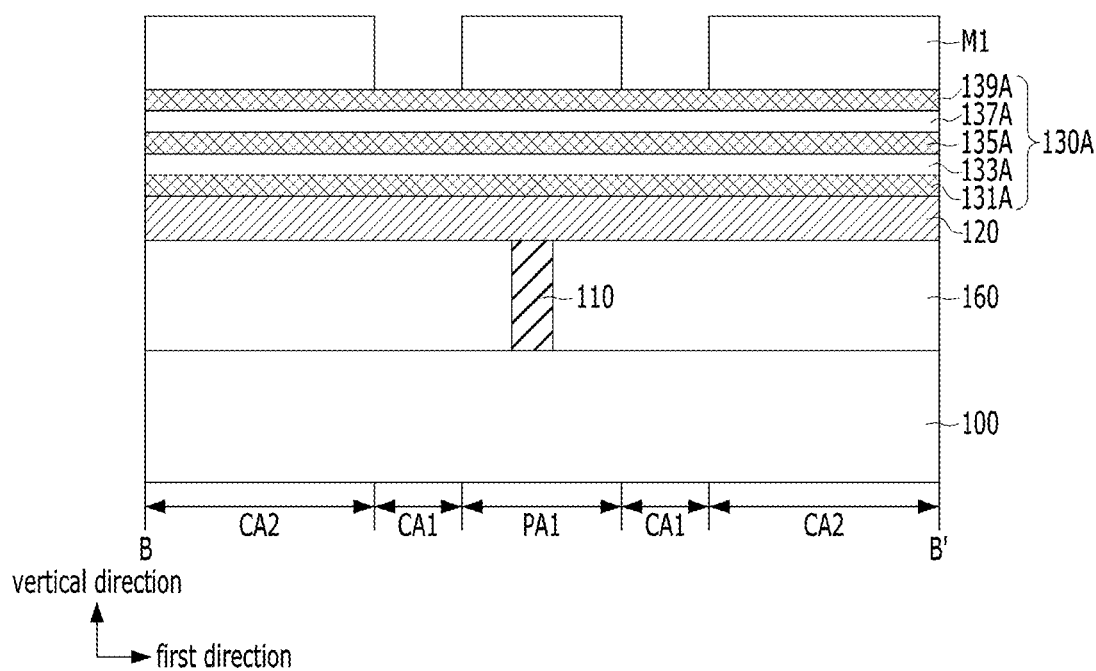

Referring to FIGS. 6A and 6B, a first mask pattern M1 may be formed over the resultant structure of FIGS. 5A and 5B to cover the second cell region CA2 while opening the first cell region CA1. In the embodiment of FIGS. 6A and 6B, the case in which the first mask pattern M1 also covers the first and second peripheral circuit regions PA1 and PA2 is illustrated. However, embodiments of the present disclosure are not limited thereto, and in another embodiment, the first and second peripheral circuit regions PA1 and PA2 may be partially or entirely exposed without being covered by the first mask pattern M1.

Subsequently, a heat treatment process may be performed on the first cell region CA1 exposed by the first mask pattern M1 (see arrow). As an example, the heat treatment process may include ultraviolet (UV) annealing. The ultraviolet annealing may be performed at a power ranging from 40% to 80% of the maximum power intensity for 2 minutes to 5 minutes at a temperature range of 200° C. to 300° C. It has been experimentally confirmed that the k value of the standard silicon oxide ($SiO_2$) for forming the first insulating material layer 172 is decreased during the UV annealing, which will be described with reference to [Table 1] below.

TABLE 1

| UV | 200C2M40% | 200C3M40% | 200C4M40% | 300C5M40% |
|---|---|---|---|---|
| k | 3.27 | 3.26 | 3.22 | 2.78 |

Referring to [Table 1] above, when UV annealing is performed at about 40% of the maximum power intensity for 2 minutes at a temperature of 200° C., it is confirmed that the k value of the $SiO_2$ film is lowered to about 3.27. In addition, when UV annealing is performed at about 40% of the maximum power intensity for 3 minutes at a temperature of 200° C., it is confirmed that the k value of the $SiO_2$ film is lowered to about 3.26. In addition, when UV annealing is performed at about 40% of the maximum power intensity for 4 minutes at a temperature of 200° C., it is confirmed that the k value of the $SiO_2$ film is lowered to about 3.22. In addition, when UV annealing is performed at about 40% of the maximum power intensity for 5 minutes at a temperature of 300° C., it is confirmed that the k value of the $SiO_2$ film is significantly lowered to about 2.78. As a result, it may be seen that the k value of the $SiO_2$ film decreases during UV annealing, and in particular, as the annealing time, or the temperature, or both increase, the k value decreases.

In addition, it has been confirmed in another experiment that the k value of the $SiO_2$ film for forming the first insulating material layer 172 is decreased during the UV annealing, which will be described with reference to [Table 2] below.

TABLE 2

| UV | 200C4M40% | 300C5M40% | 300C5M60% | 300C5M80% |
|---|---|---|---|---|
| k | 2.76 | 2.65 | 2.57 | 2.52 |

Referring to [Table 2] above, when UV annealing is performed at about 40% of the maximum power intensity for 4 minutes at a temperature of 200° C., it is confirmed that the k value of the $SiO_2$ film is lowered to about 2.76. In addition, when UV annealing is performed at about 40% of the maximum power intensity for 5 minutes at a temperature of 300° C., it is confirmed that the k value of the $SiO_2$ film is lowered to about 2.65. In addition, when UV annealing is performed at about 60% of the maximum power intensity for 5 minutes at a temperature of 300° C., it is confirmed that the k value of the $SiO_2$ film is lowered to about 2.57. In addition, when UV annealing is performed at about 80% of the maximum power intensity for 5 minutes at a temperature of 300° C., it is confirmed that the k value of the $SiO_2$ film is lowered to about 2.52. As a result, it may be seen that the k value of the $SiO_2$ film decreases during UV annealing, and in particular, as one or more the annealing time, temperature, and power increase, the k value decreases.

However, embodiments of the present disclosure are not limited thereto, and any heat treatment process may be performed on the first cell region CA1 as long as the k value of the first insulating material layer 172 is reduced. For example, a bake process, a heat treatment process using a gas or plasma of helium, nitrogen, or the like, or a heat treatment process involving ion implantation may be performed.

Figure 7A:
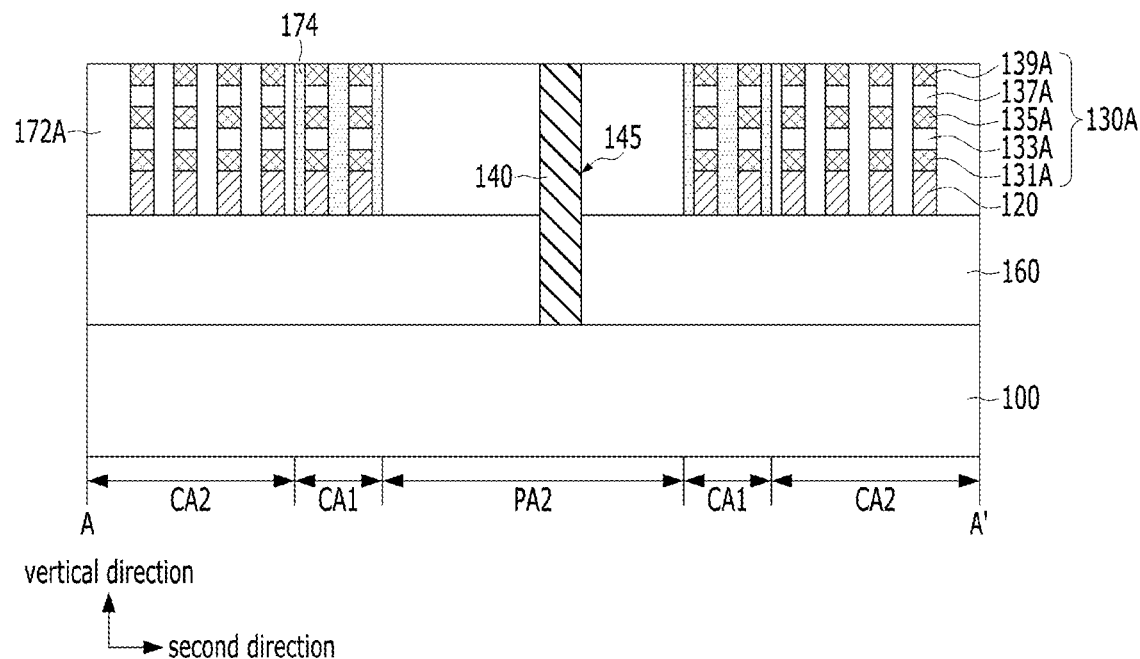
Figure 7B:
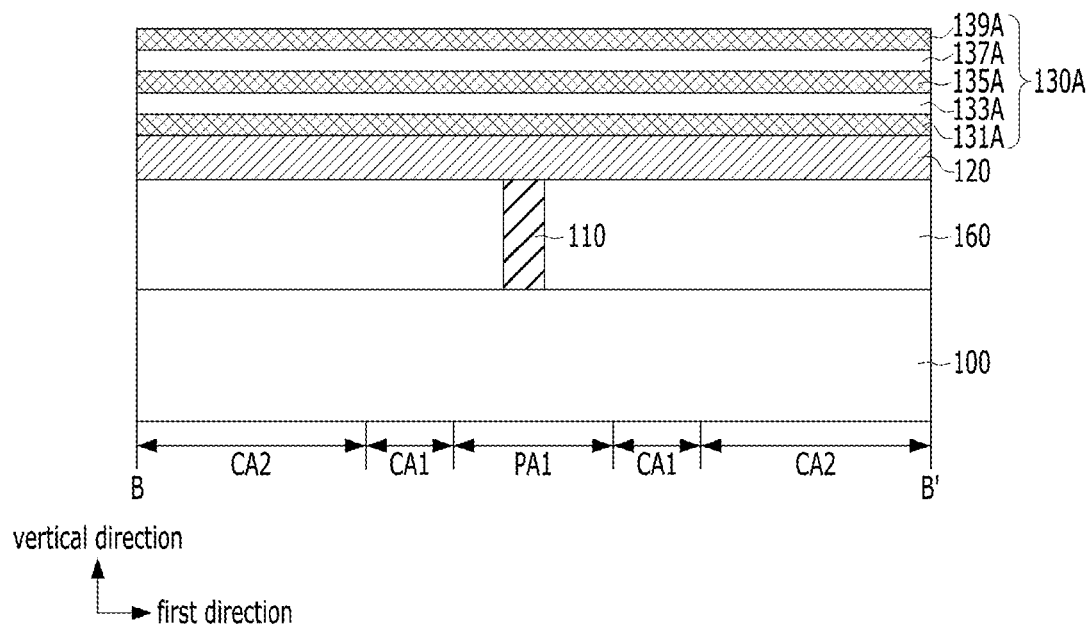

The resultant structure of FIGS. 6A and 6B are shown in FIGS. 7A and 7B.

Referring to FIGS. 7A and 7B, one or more portions of the first insulating material layer 172 that is affected by the UV annealing of FIGS. 6A and 6B to have a different characteristic (e.g., lower dielectric constant k) will be referred to as a second insulating material layer 174. A remaining portion without being significantly affected the UV annealing in the first insulating material layer 172 is denoted by reference numeral 172A. The second insulating material layer 174 may be filled between the first lines 120 and the memory cells 130 in the first cell region CA1, and may have a smaller k value than that of the first insulating material layer 172A. The first insulating material layer 172A may be filled between the first lines 120 and the memory cells 130 in the second cell region CA2. Because the initial upper electrode layer 139A is positioned at the uppermost portion of the initial memory cell 130A during the UV annealing, the initial variable resistance layer 137A may not be affected by the UV annealing, so that its characteristics may be maintained.

After the UV annealing, the first mask pattern M1 may be removed.

Figure 8A:
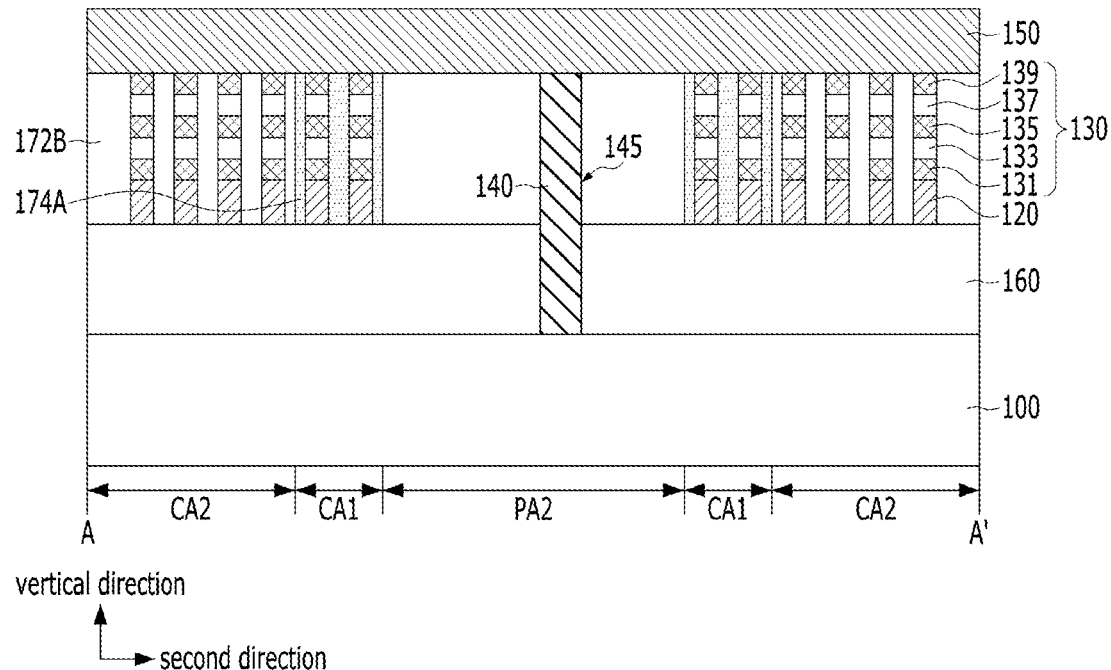
Figure 8B:
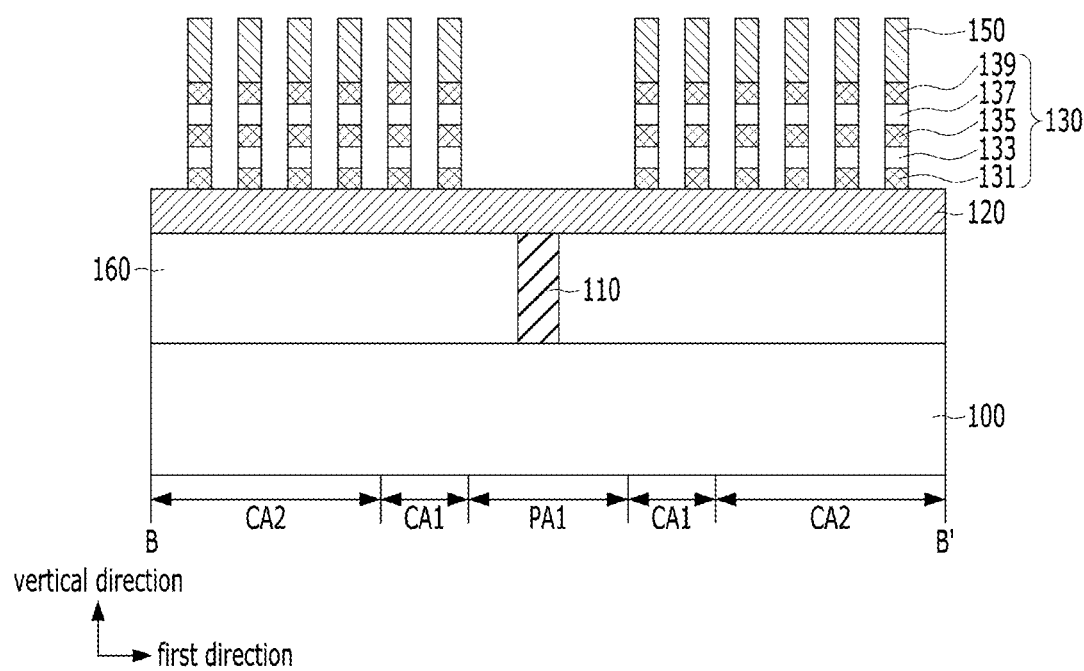

Referring to FIGS. 8A and 8B, second lines 150 may be formed over the resultant structure of FIGS. 7A and 7B. The second lines 150 may be formed by depositing a conductive layer for forming the second lines 150, and etching the conductive layer using a line-shaped mask pattern (not shown) extending in the second direction as an etching barrier.

Subsequently, memory cells 130 may be formed by etching the initial memory cells 130A exposed by the second lines 150. As a result of this process, the memory cell 130 may have an island shape in a plan view while being positioned at each of intersections between the first lines 120 and the second lines 150. In the first direction, both sidewalls of the memory cell 130 may be aligned with both sidewalls of the second line 150, and in the second direction, both sidewalls of the memory cell 130 may be aligned with both sidewalls of the first line 120. The memory cell 130 may include a stacked structure of a lower electrode layer 131, a selection element layer 133, an intermediate electrode layer 135, a variable resistance layer 137, and an upper electrode layer 139.

In the process of forming the memory cells 130, the first insulating material layer 172A and the second insulating material layer 174 exposed by the second lines 150 may also be etched to form a first insulating material pattern 172B and a second insulating material pattern 174A. A space between the first lines 120 in the first cell region CA1 may be filled with the second insulating material pattern 174A, and a space between the first lines 120 in the second cell region CA2 may be filled with the first insulating material pattern 172B. In addition, in the first cell region CA1, a space between the memory cells 130 in the second direction may be filled with the second insulating material pattern 174A, and a space between the memory cells 130 in the first direction may be an empty space. In addition, in the second cell region CA2, a space between the memory cells 130 in the second direction may be filled with the first insulating material pattern 172B, and a space between the memory cells 130 in the first direction may be an empty space.

Figure 9A:
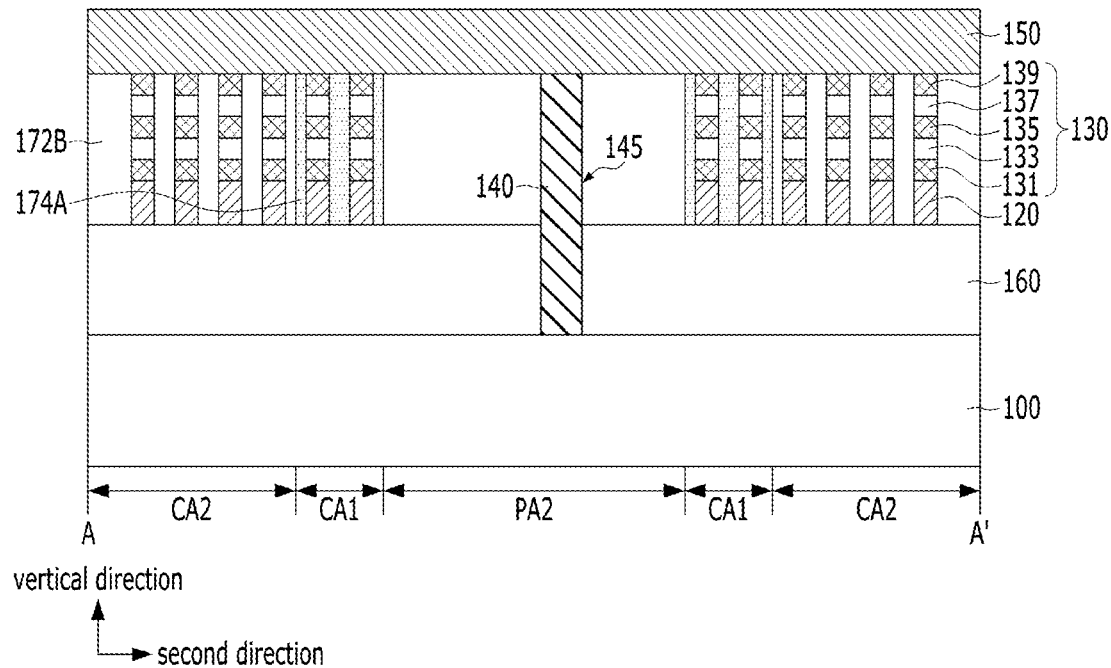
Figure 9B:
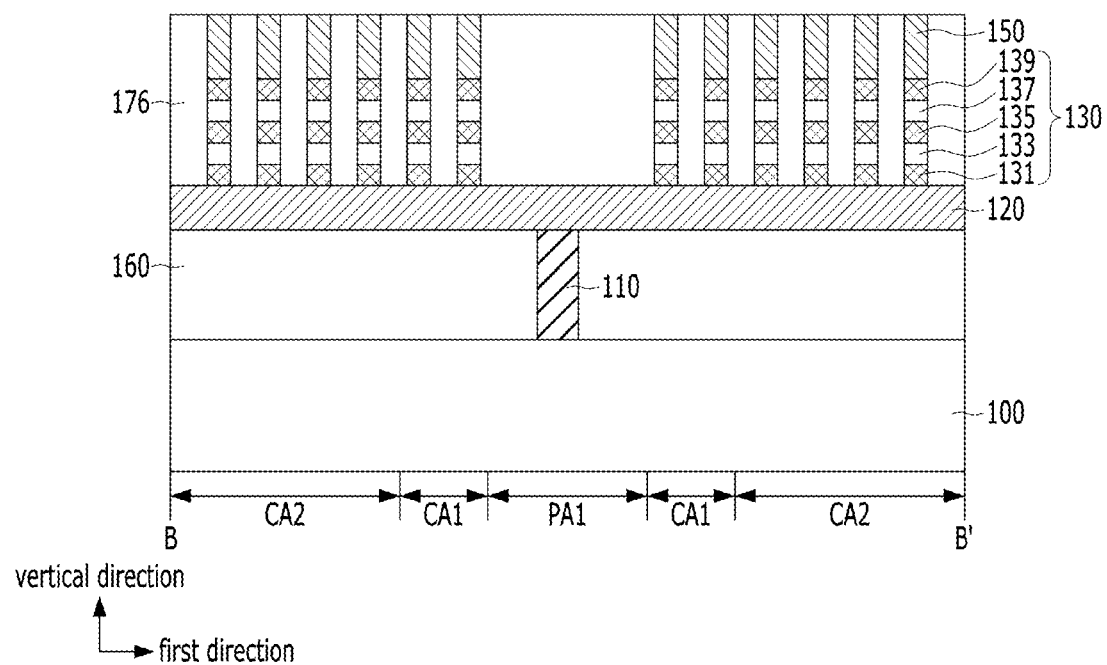

Referring to FIGS. 9A and 9B, a third insulating material layer 176 may be formed over the resultant structure of FIGS. 8A and 8B to fill the spaces between the second lines 150 and between the memory cells 130 in the first direction. The third insulating material layer 176 may be formed by depositing an insulating material having a thickness sufficient to cover the second line 150, and performing a planarization process until an upper surface of the second line 150 is exposed. The third insulating material layer 176 may be formed by a spin on coating (SOC) method, and may include standard silicon oxide. The third insulating material layer 176 may be formed of the same material as the first insulating material pattern 172B. However, embodiments of the present disclosure are not limited thereto, and various deposition methods and insulating materials may be used when forming the third insulating material layer 176. Here, the third insulating material layer 176 may include a material whose k value decreases during heat treatment.

Figure 10A:
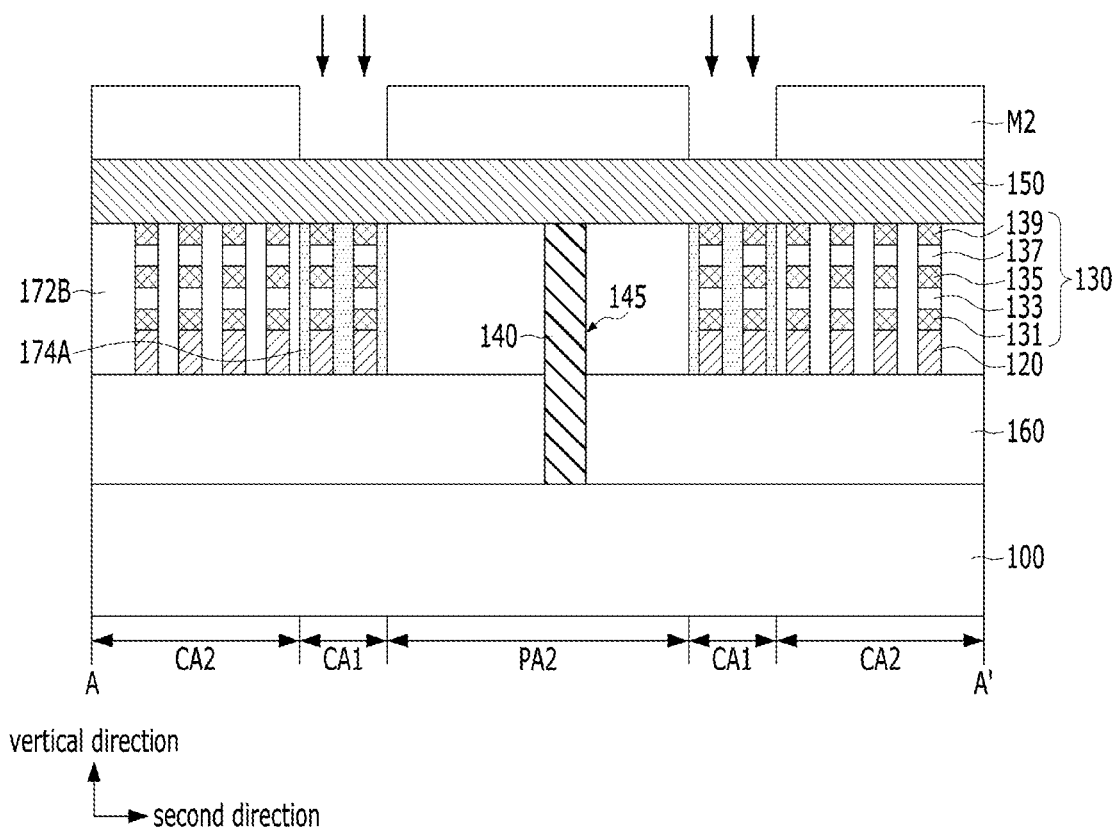
Figure 10B:
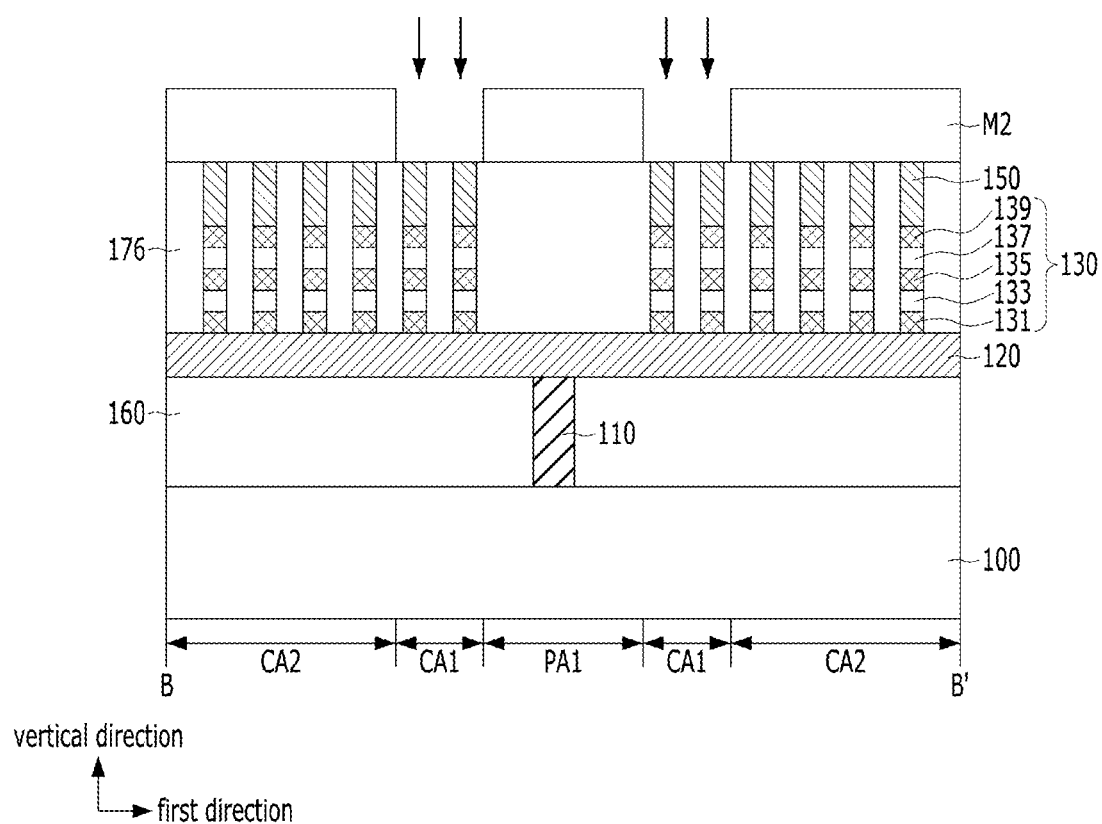

Referring to FIGS. 10A and 10B, a second mask pattern M2 may be formed over the resultant structure of FIGS. 9A and 9B to cover the second cell region CA2 while opening the first cell region CA1. In the embodiment of FIGS. 10A and 10B, the case in which the second mask pattern M2 also covers the first and second peripheral circuit regions PA1 and PA2 is illustrated. However, embodiments of the present disclosure are not limited thereto, and in another embodiment, the first and second peripheral circuit regions PA1 and PA2 may be partially or entirely exposed without being covered by the second mask pattern M2.

Subsequently, a heat treatment process may be performed on the first cell region CA1 exposed by the second mask pattern M2 (see arrow). As an example, the heat treatment process may include UV annealing. The UV annealing may be performed at a power ranging from 40% to 80% of the maximum power intensity for 2 minutes to 5 minutes at a temperature range of 200° C. to 300° C. During the UV annealing, the k value of the third insulating material layer 176 in the first cell region CA1 may be decreased.

Figure 11A:
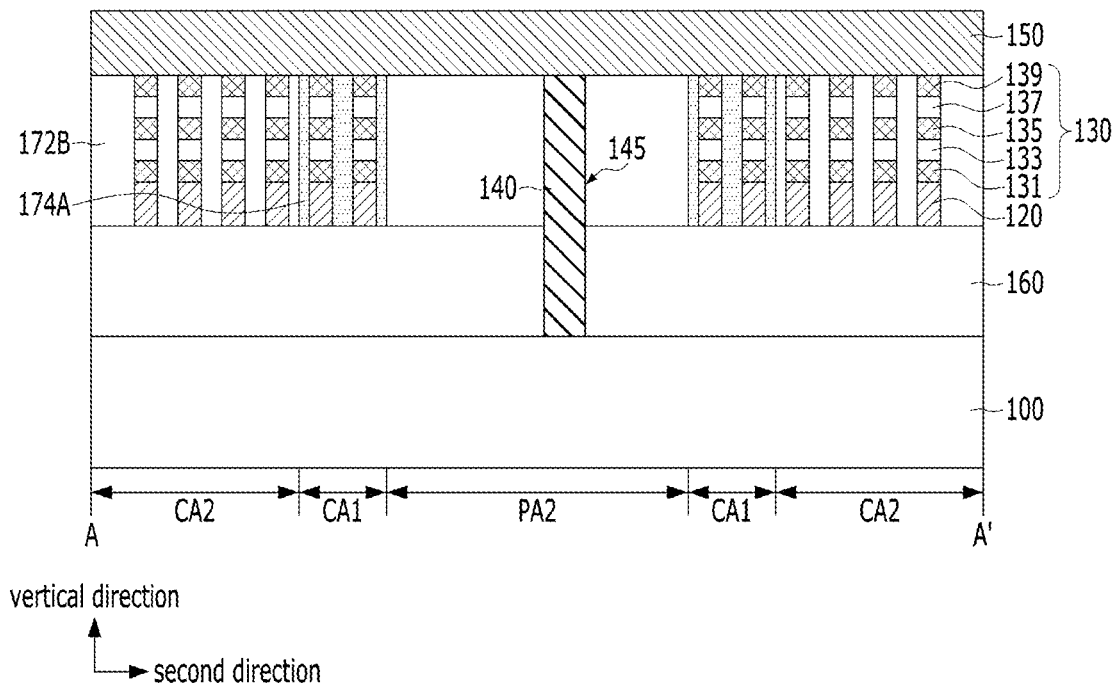
Figure 11B:
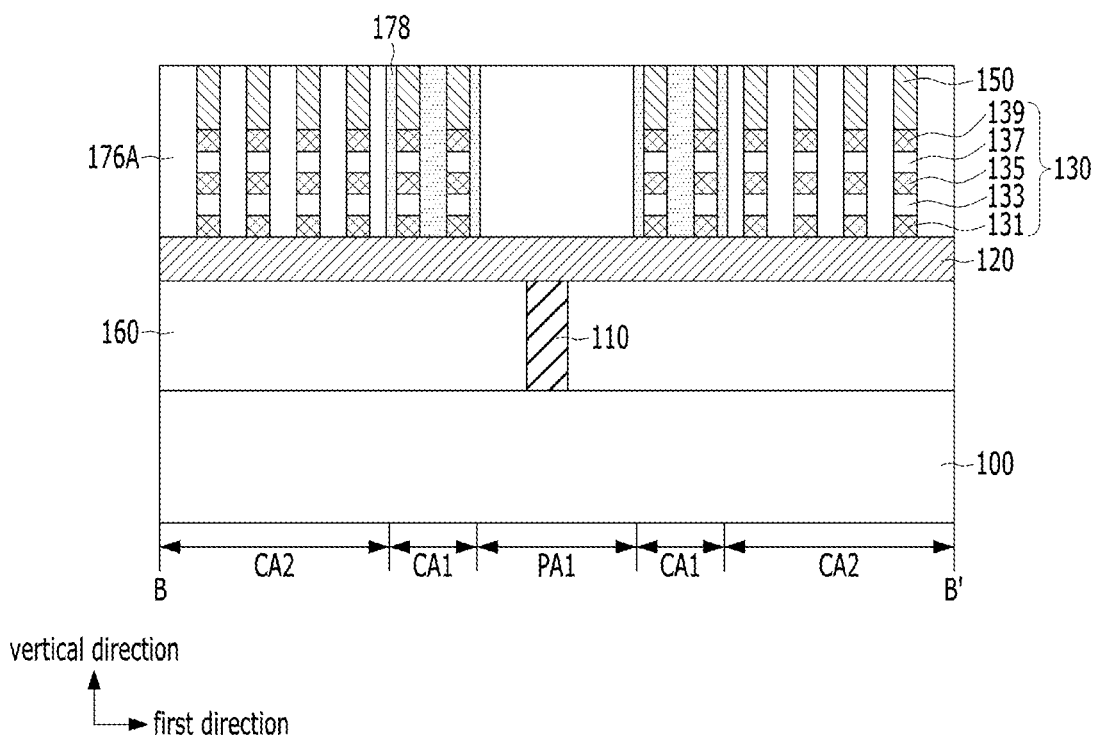

The resultant structure of FIGS. 10A and 10B are shown in FIGS. 11A and 11B.

Referring to FIGS. 11A and 11B, one or more portions of the third insulating material layer 176 that is affected by the UV annealing of FIGS. 10A and 10B to have a different characteristic (e.g., lower dielectric constant k) will be referred to as a fourth insulating material layer 178. The fourth insulating material layer 178 may be formed of the same material as the second insulating material pattern 174A. A remaining portion without being significantly affected by the UV annealing in the third insulating material layer 176 is denoted by reference numeral 176A. In the first cell region CA1, the fourth insulating material layer 178 may be filled between the second lines 150 and the memory cells 130 in the first direction, and may have a smaller k value than that of the third insulating material layer 176A. In the second cell region CA2, the third insulating material layer 176A may be filled between the second lines 150 and the memory cells 130 in the first direction. Because the upper electrode layer 139 is positioned at the uppermost portion of the memory cell 130 during the UV annealing, the variable resistance layer 137 may not be affected by the UV annealing, so that its characteristics may be maintained.

After the UV annealing, the second mask pattern M2 may be removed.

By the above-described processes, a memory device substantially the same as that described in FIGS. 1, 2A, and 2B may be obtained. The second insulating material pattern 174A and the fourth insulating material layer 178 of the first cell region CA1 may be substantially the same as the first insulating material layer 170-1 of FIGS. 2A and 2B, and the first insulating material pattern 172B and the third insulating material layer 176A of the second cell region CA2 may be substantially the same as the second insulating material layer 170-2 of FIGS. 2A and 2B.

FIGS. 12A to 17B are cross-sectional views illustrating a memory device according to another embodiment of the present disclosure, and a method for fabricating the same. FIGS. 12A, 13A, 14A, 15A, 16A, and 17A are shown based on a cross section taken along the line A-A' of FIG. 1, and FIGS. 12B, 13B, 14B, 15B, 16B, and 17B are shown based on another cross section along the line B-B' of FIG. 1. It will be described focusing on differences from the above-described embodiment.

Figure 12A:
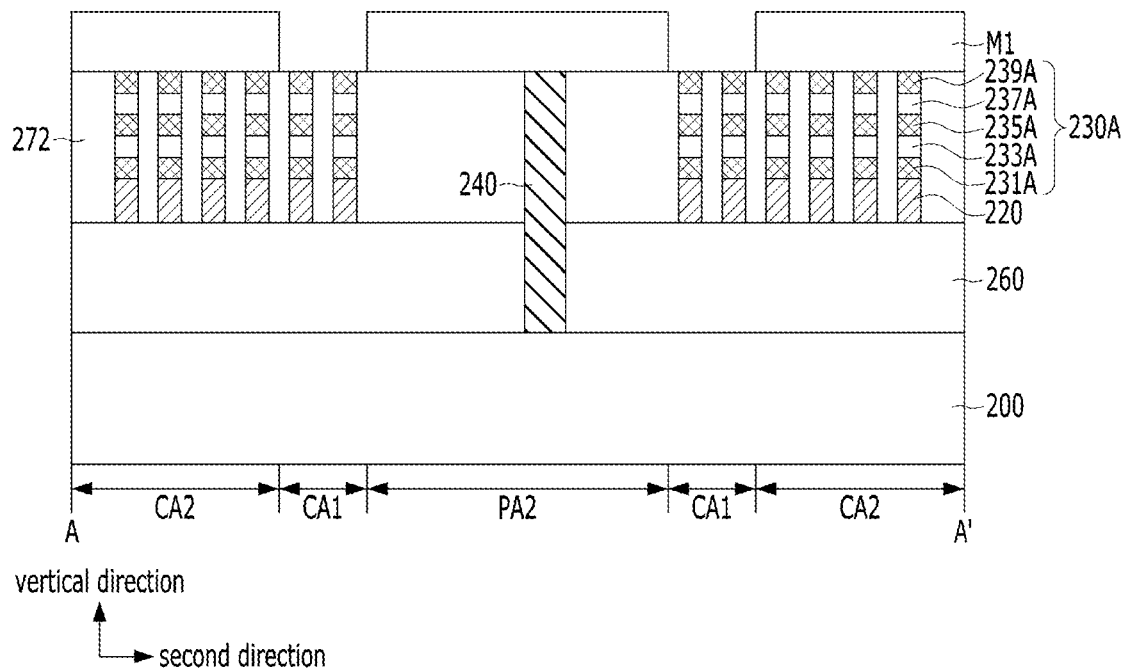
FIGS. 12A, 12B, 13A, 13B, 14A, 14B, 15A, 15B, 16A, 16B, 17A, and 17B are cross-sectional views illustrating a memory device according to another embodiment of the present disclosure, and a method for fabricating the same.
Figure 12B:
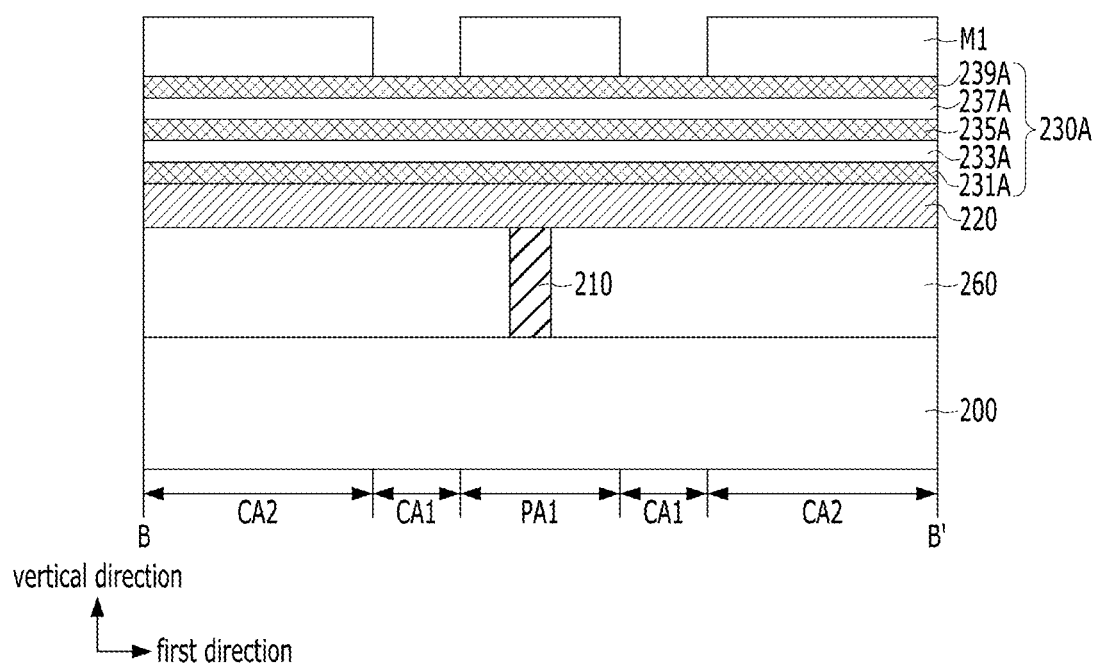

Referring to FIGS. 12A and 12B, processes substantially the same as the processes of FIGS. 4A to 5B described above may be performed. As a result, a substrate 200 including a first cell region CA1, a second cell region CA2, a first peripheral circuit region PA1, and a second peripheral circuit region PA2, a first interlayer insulating layer 260 disposed over the substrate 200, a first contact plug 210 connected to a portion of the substrate 200 through the first interlayer insulating layer 260 of the first peripheral circuit region PA1, a stacked structure of a first line 220 and an initial memory cell 230A disposed over the first interlayer insulating layer 260 and extending in a first direction to be connected to the first contact plug 210, a first insulating material layer 272 disposed over the first interlayer insulating layer 260 and filling spaces between the stacked structures of the first lines 220 and the initial memory cells 230A, and a second contact plug 240 connected to a portion of the substrate 200 through the first insulating material layer 272 and the first interlayer insulating layer 260 of the second peripheral circuit region PA2, may be provided. Here, the initial memory cell 230A may include a stacked structure of an initial lower electrode layer 231A, an initial selection element layer 233A, an initial intermediate electrode layer 235A, an initial variable resistance layer 237A, and an initial upper electrode layer 239A.

Subsequently, a first mask pattern M1 covering the second cell region CA2 while opening the first cell region CA1 may be formed over the above structure.

Figure 13A:
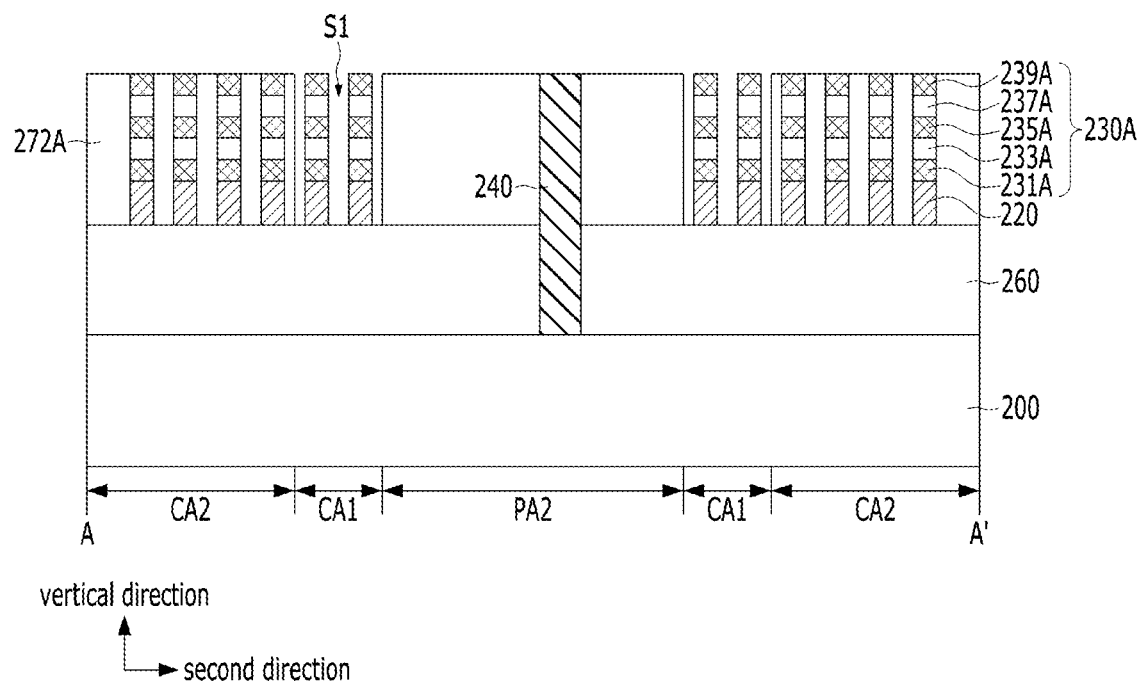
Figure 13B:
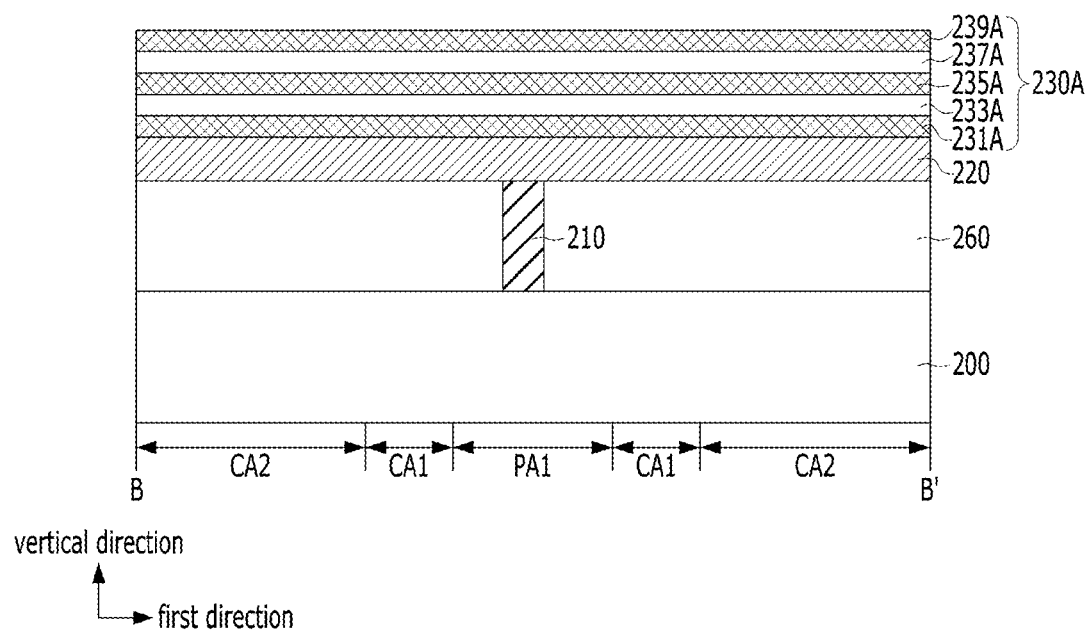

Referring to FIGS. 13A and 13B, the first insulating material layer 272 exposed by the first mask pattern M1 may be removed. The removal of the first insulating material layer 272 may be performed by an etching method using an etching gas or the like that selectively removes only the insulating material, and thus, the first lines 220 and the initial memory cells 230A of the first cell region CA1 may be substantially maintained. A space formed by the removal of the first insulating material layer 272 in the first cell region CA1 will be referred to as a first space S1. Also, a remaining portion of the first insulating material layer 272, which remains in the second cell region CA2 without being removed in this process, is denoted by reference numeral 272A.

After the first space S1 is formed, the first mask pattern M1 may be removed.

Figure 14A:
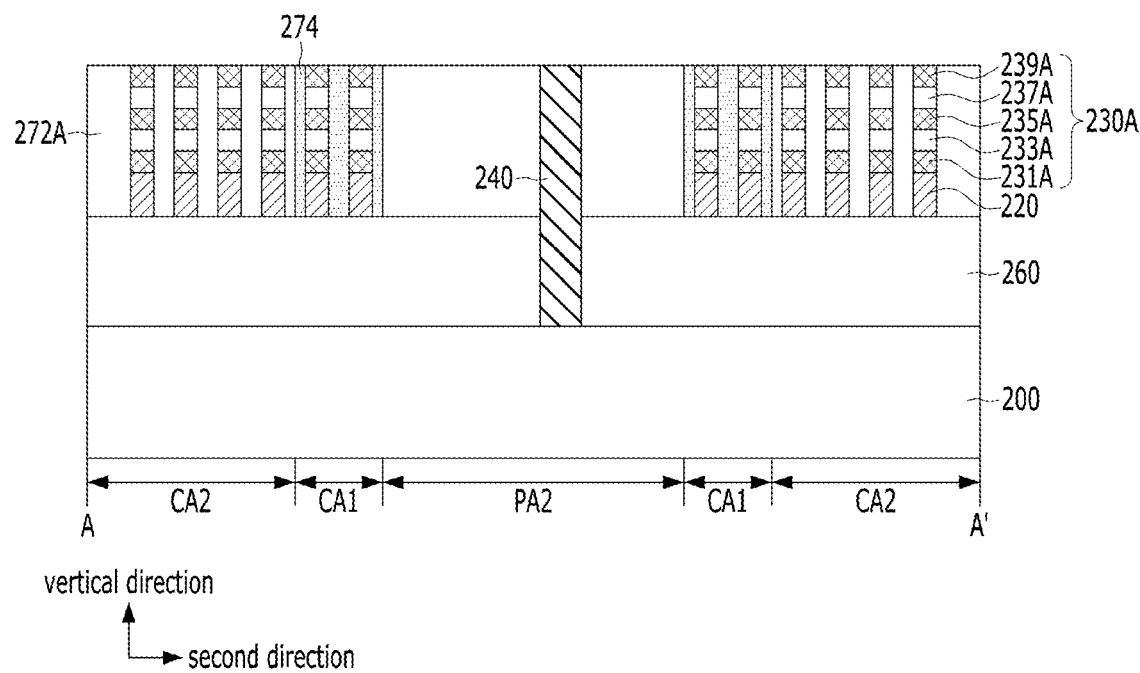
Figure 14B:
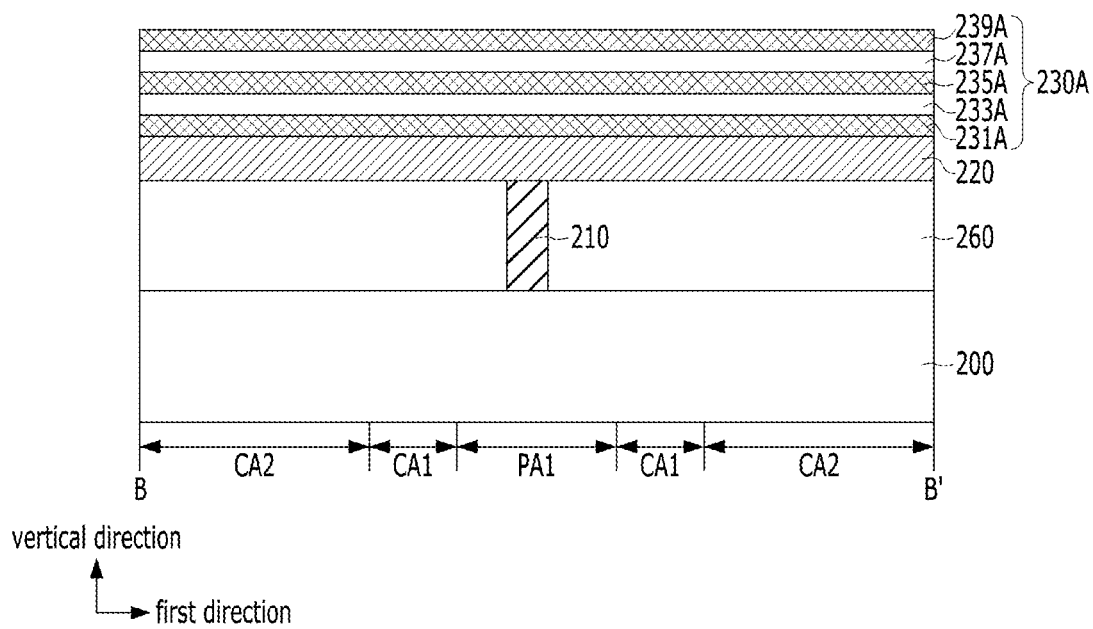

Referring to FIGS. 14A and 14B, a second insulating material layer 274 filling the first space S1 of FIGS. 13A and 13B may be formed. The second insulating material layer 274 may have a lower k value than the first insulating material layer 272A. For example, when the first insulating material layer 272A includes standard silicon oxide, the second insulating material layer 274 may include SiCOH, HSQ, MSQ, SiCH, SiCNH, or a combination thereof.

The second insulating material layer 274 may be formed by depositing an insulating material having a thickness sufficiently covering the resultant structure of FIGS. 13A and 13B, and performing a planarization process until the upper surface of the initial memory cell 230A is exposed.

Figure 15A:
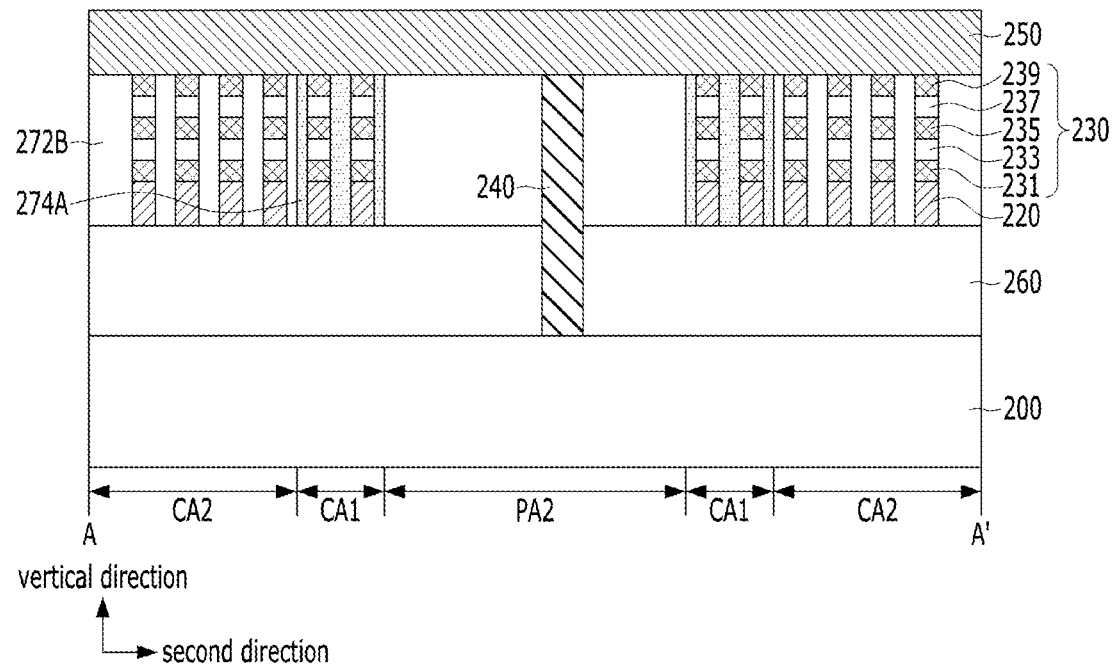
Figure 15B:
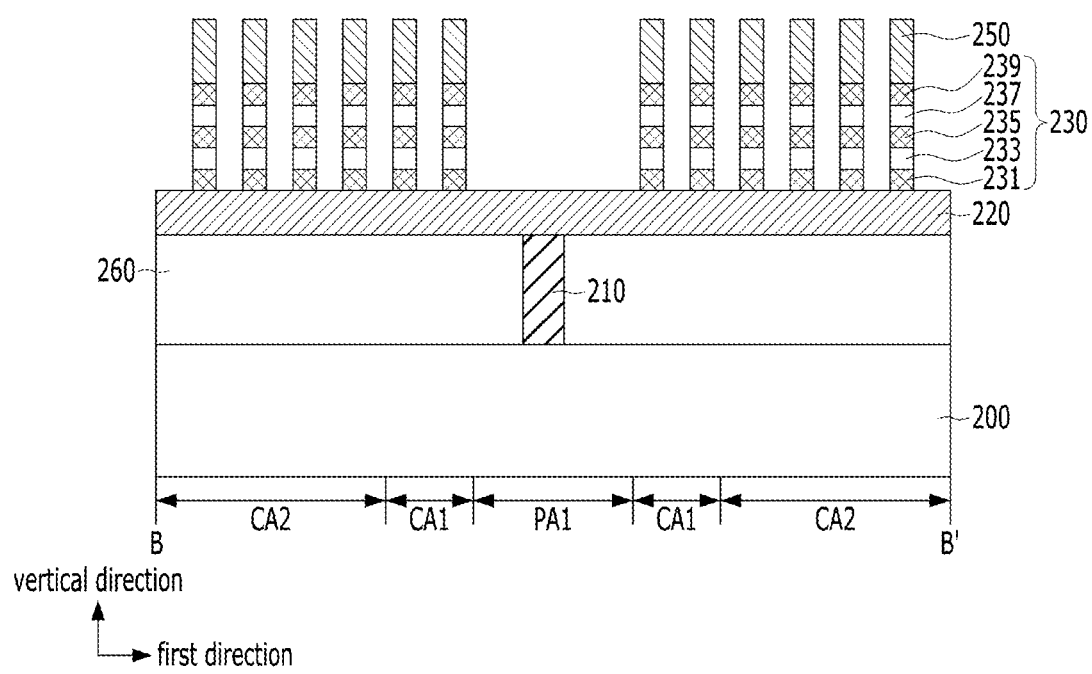

Referring to FIGS. 15A and 15B, second lines 250 may be formed over the resultant structure of FIGS. 14A and 14B.

Subsequently, memory cells 230 may be formed by etching the initial memory cells 230A exposed by the second lines 250. The memory cell 230 may include a stack structure of a lower electrode layer 231, a selection element layer 233, an intermediate electrode layer 235, a variable resistance layer 237, and an upper electrode layer 239.

In the process of forming the memory cells 230, the first insulating material layer 272A and the second insulating material layer 274 exposed by the second lines 250 may also be etched to form the first insulating material pattern 272B and the second insulating material pattern 274A.

Figure 16A:
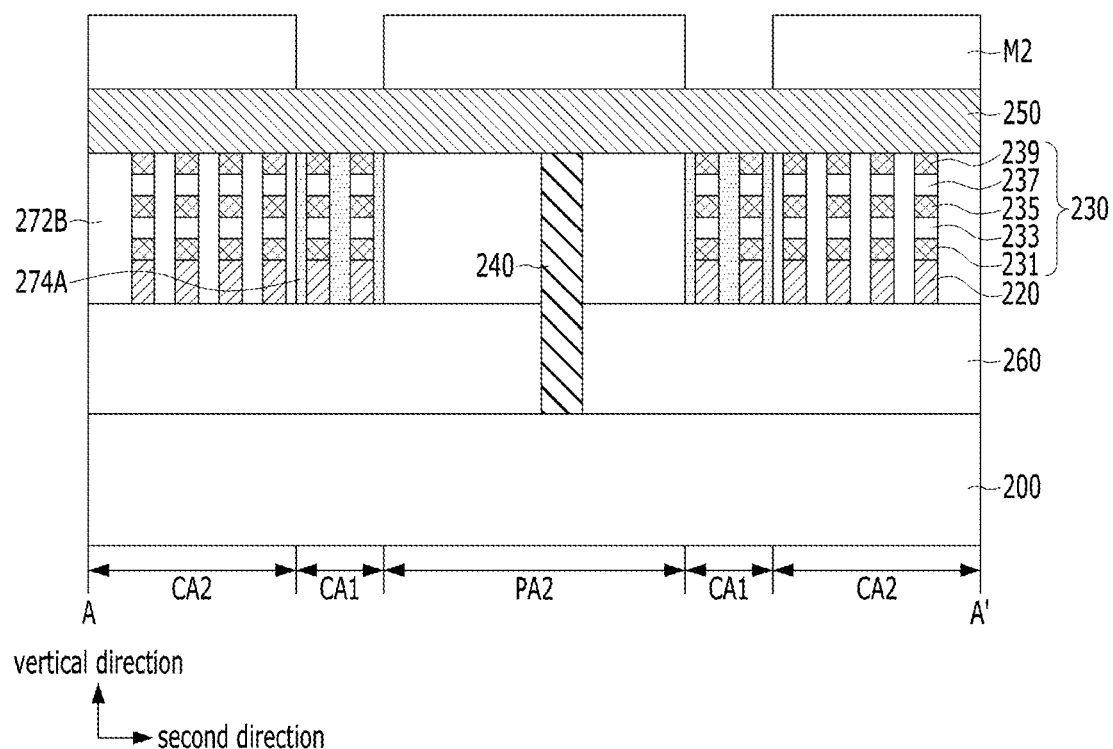
Figure 16B:
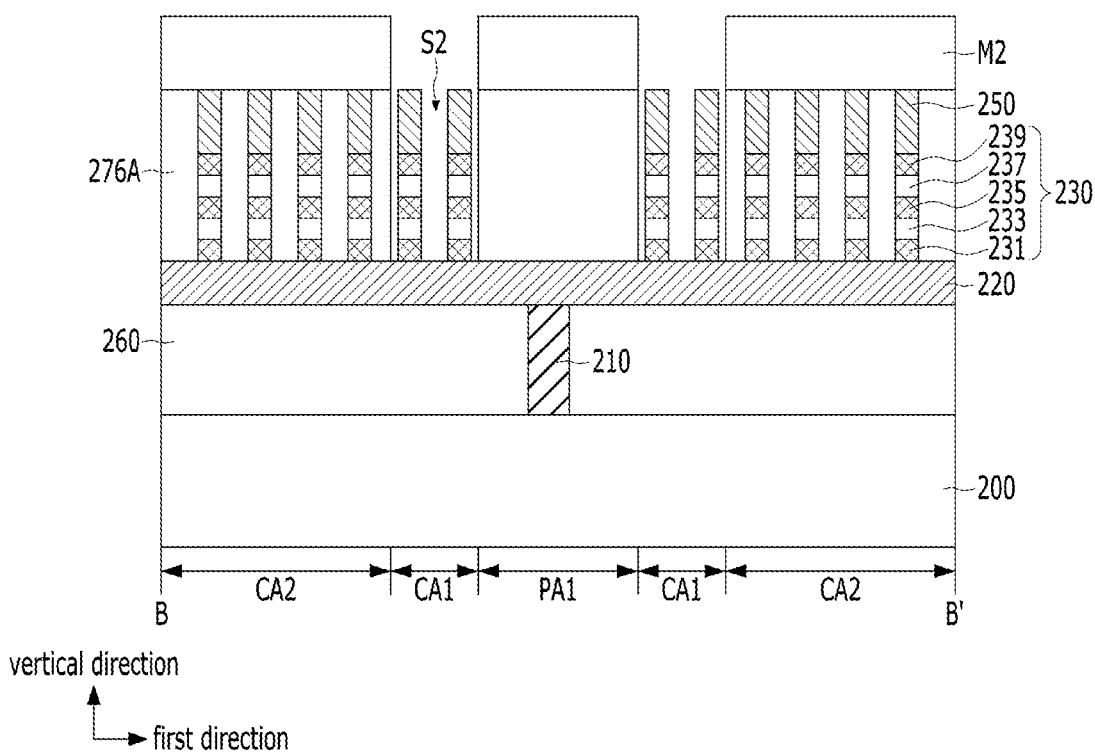

Referring to FIGS. 16A and 16B, a third insulating material layer 276A filling spaces between the second lines 250 and between the memory cells 230 in the first direction may be formed, and then, a second space S2 may be formed by removing the third insulating material layer 276A using a second mask pattern M2 covering the second cell region CA2 while opening the first cell region CA1.

Figure 17A:
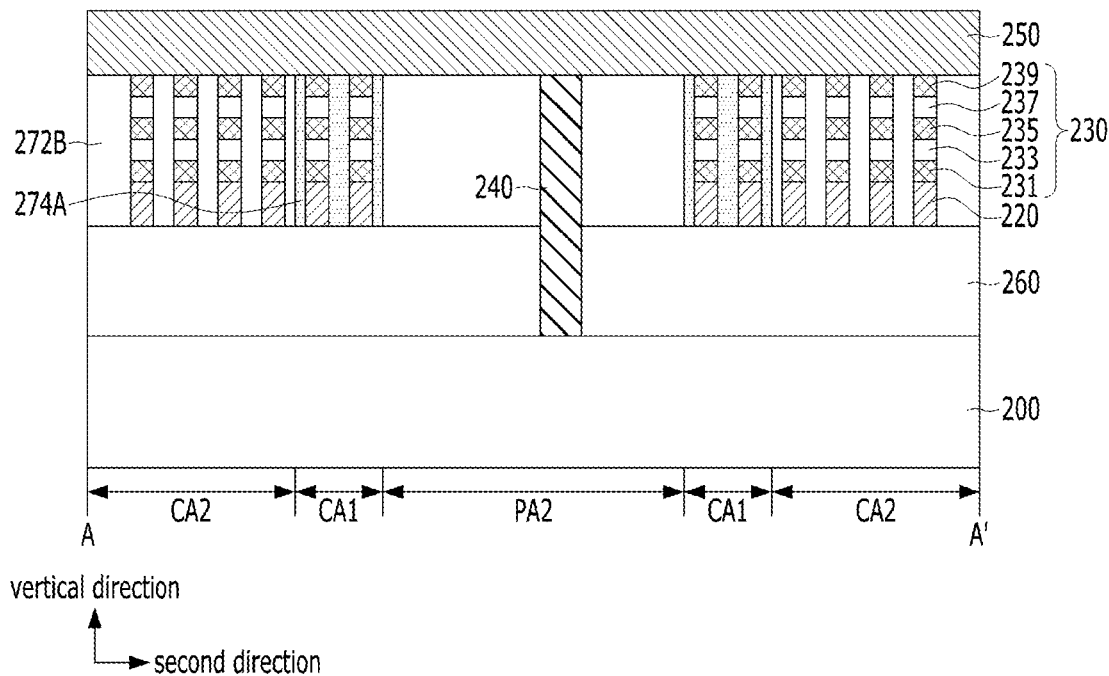
Figure 17B:
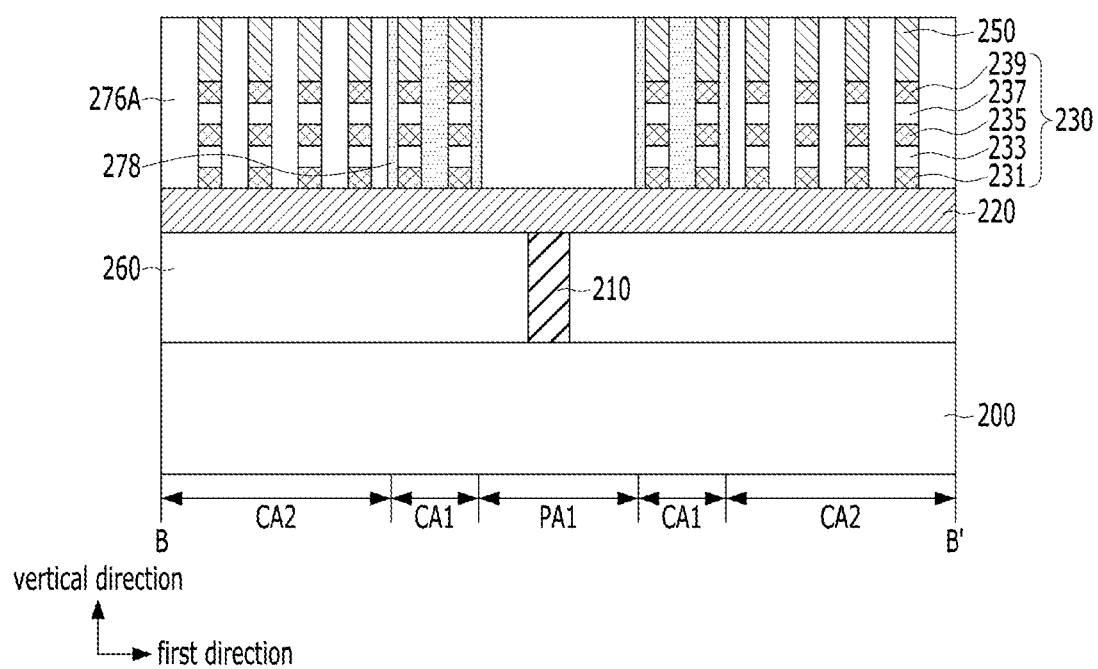

Referring to FIGS. 17A and 17B, a fourth insulating material layer 278 filling the second space S2 of FIGS. 16A and 16B may be formed. The second insulating material layer 278 may have a lower k value than the third insulating material layer 276A. For example, when the third insulating material layer 276A includes standard silicon oxide, the fourth insulating material layer 278 may include SiCOH, HSQ, MSQ, SiCH, SiCNH, or a combination thereof.

By the above-described processes, a memory device substantially the same as that described in FIGS. 1, 2A, and 2B may be obtained. The second insulating material pattern 274A and the fourth insulating material layer 278 of the first cell region CA1 may be substantially the same as the first insulating material layer 170-1 of FIGS. 2A and 2B, and the first insulating material pattern 272B and the third insulating material layer 276A of the second cell region CA2 may be substantially the same as the second insulating material layer 170-2 of FIGS. 2A and 2B.

Meanwhile, in the above-described embodiments, the case in which the low-k material is interposed between the first lines (e.g., first lines 120 in FIGS. 11A and 11B and 220 in FIGS. 17A and 17B) and between the second lines (e.g., the second lines 150 in FIGS. 11A and 11B and 250 in FIGS. 17A and 17B) in the first cell region CA1 has been described. For example, in the above-described embodiments, the low-k material may be positioned between first portions of the first lines, or between second portions of the plurality of second lines, or both, in the first cell region CA1. An adjacent pair of the first portions of the first lines may be arranged in the second direction to be spaced apart from each other, and an adjacent pair of the second portions of the plurality of second lines may be arranged in the first direction to be spaced apart from each other. As a result, a relatively low capacitance associated with the low-k material may be formed either between an adjacent pair of the first lines, or between an adjacent pair of the second lines, or both. In some cases, even if a low-k material is interposed either between the first lines and or between the second lines, the current supplied to the memory cells 130 or 230 of the first cell region CA1 may be limited to a desirable extent. These examples will be described with reference to FIGS. 18A to 19B below.

Figure 18A:
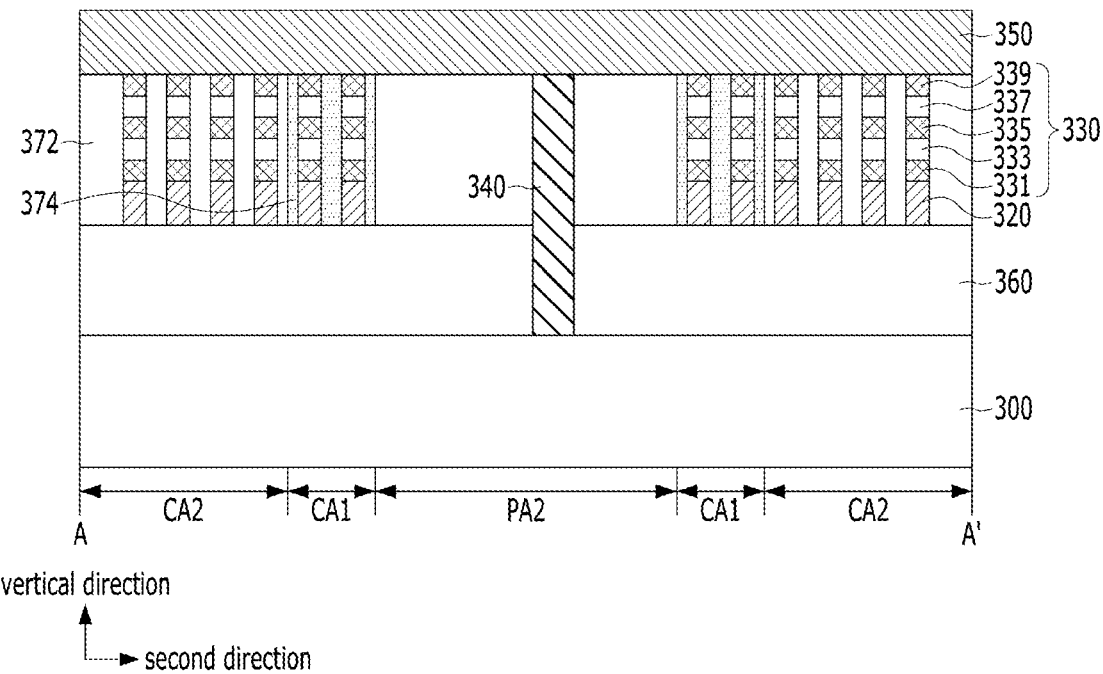
FIGS. 18A and 18B are cross-sectional views illustrating a memory device according to another embodiment of the present disclosure, and a method for fabricating the same.
Figure 18B:
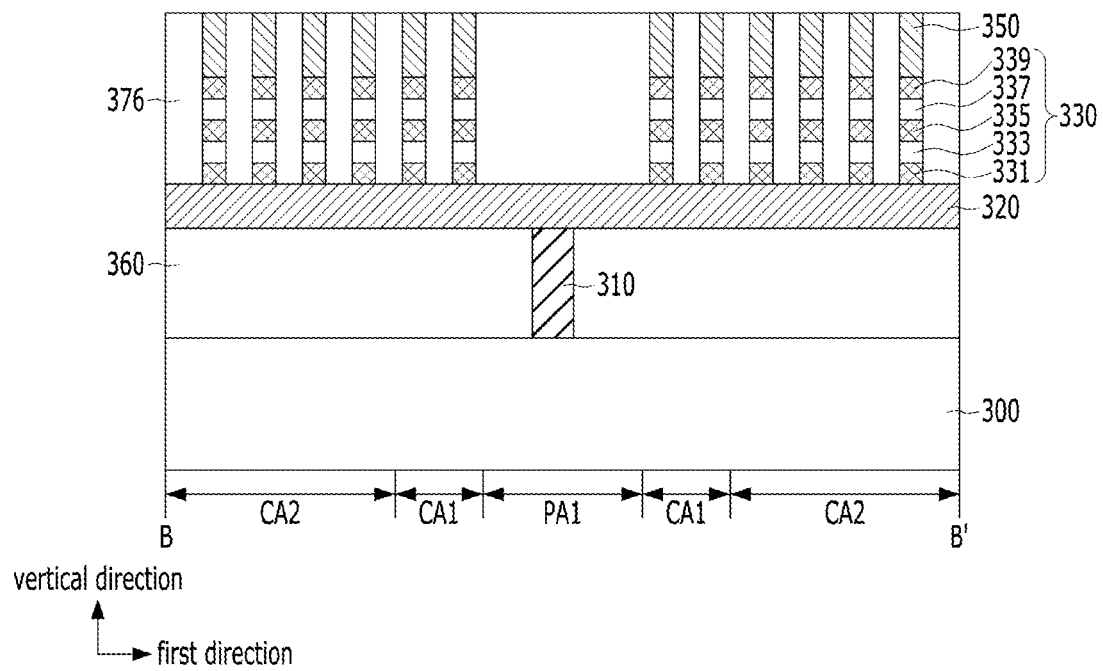

FIGS. 18A and 18B are cross-sectional views illustrating a memory device according to another embodiment of the present disclosure, and a method for fabricating the same. FIG. 18A is shown based on a cross section taken along the line A-A' of FIG. 1, and FIG. 18B is shown based on another cross section along the line B-B' of FIG. 1. It will be described focusing on differences from the above-described embodiment.

Referring to FIGS. 18A and 18B, a memory device may include a substrate 300 including a first cell region CA1, a second cell region CA2, a first peripheral circuit region PA1, and a second peripheral circuit region PA2, first lines 320 extending in a first direction over the substrate 300, second lines 350 extending in a second direction over the first lines 320, and memory cells 330 respectively positioned at intersections of the first lines 320 and the second lines 350 between the first lines 320 and the second lines 350. The memory cell 330 may include a multi-layered structure including a lower electrode layer 331, a selection element layer 333, an intermediate electrode layer 335, a variable resistance layer 337, and an upper electrode layer 339.

A first interlayer insulating layer 360 may be interposed between the substrate 300 and the first lines 320 in a vertical direction. The first line 320 may be connected to a portion of the substrate 300 through a first contact plug 310 penetrating the first interlayer insulating layer 360 in the first peripheral circuit region PA1.

Also, in the vertical direction, first, second, and third insulating material layers 372, 374, and 376 may be interposed between the first lines 320 and the second lines 350. The second line 350 may be connected to a portion of the substrate 300 through a second contact plug 340 penetrating the first insulating material layer 372 and the first interlayer insulating layer 360 in the second peripheral circuit region PA2.

Here, the first insulating material layer 372 may be filled between the memory cells 330 in the second direction while being filled between the first lines 320 in the second cell region CA2. The second insulating material layer 374 may be filled between the memory cells 330 in the second direction while being filled between the first lines 320 in the first cell region CA1. The third insulating material layer 376 may be filled between the memory cells 330 in the first direction while being filled between the second lines 350 in the first and second cell regions CA1 and CA2. The k value of the second insulating material layer 374 may be lower than the k value of the first and third insulating material layers 372 and 376.

The formation of the first to third insulating material layers 372, 374, and 376 may be possible by omitting the processes of FIGS. 10A to 11B in the manufacturing method of the embodiment of FIGS. 4A to 11B described above.

Alternatively, the formation of the first to third insulating material layers 372, 374, and 376 may be possible by performing the processes of FIGS. 12A to 16B without forming the second space S2 in the manufacturing method of the embodiment of FIGS. 12A to 17B described above.

According to the embodiment in FIGS. 18A and 18B, a low-k material may be interposed between the first lines 320 in the first cell region CA1, and thus, capacitance due to the low-k material may be reduced. For example, a first capacitance defined by a pair of first adjacent portions of the first lines 320 in the first cell region CA1 and a portion of the second insulating material layer 374 disposed between the first adjacent portions of the first lines 320 may be smaller than a second capacitance defined by a pair of second adjacent portions of the first lines 320 in the second cell region CA2 and a portion of the first insulating material layer 372 disposed between the second adjacent portions of the first lines 320.

Figure 19A:
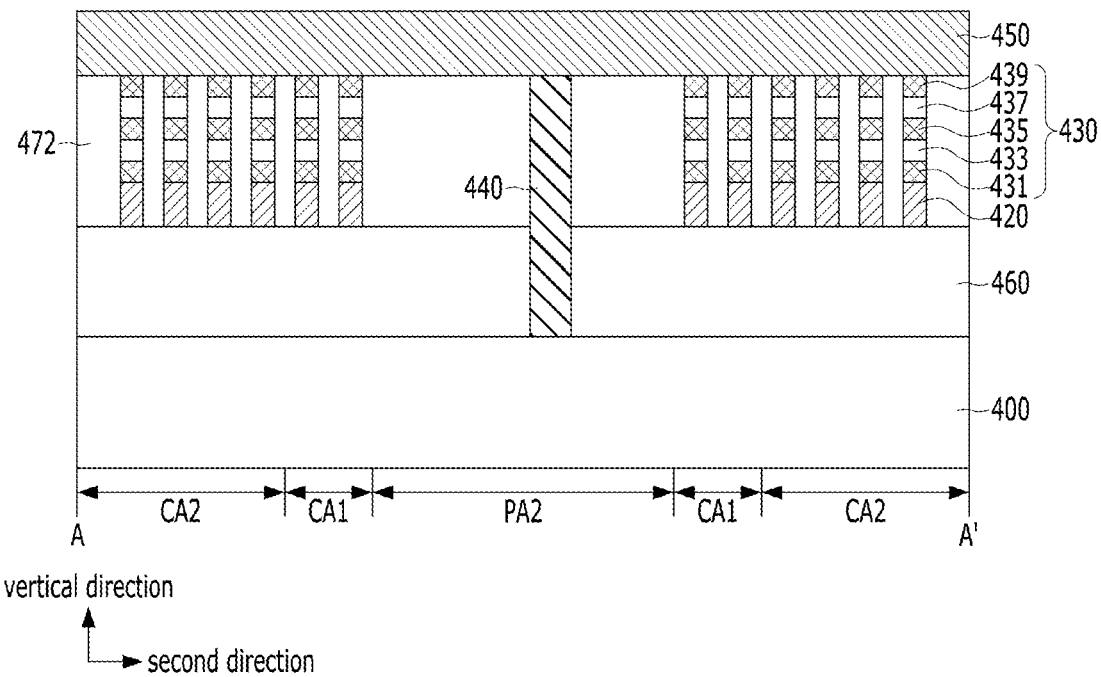
FIGS. 19A and 19B are cross-sectional views illustrating a memory device according to another embodiment of the present disclosure.
Figure 19B:
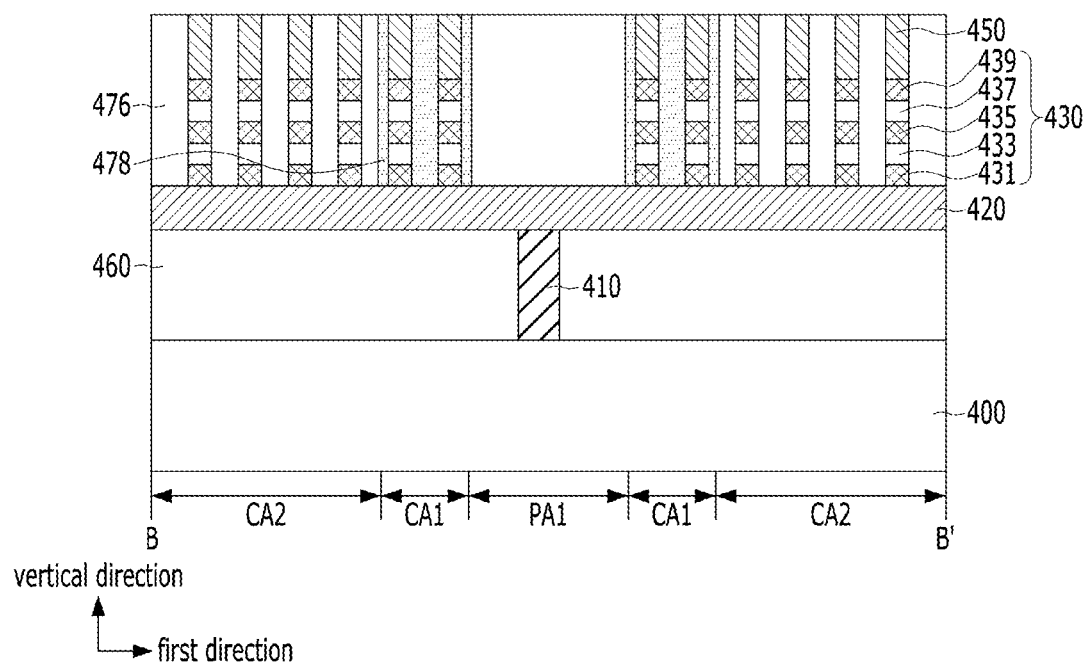

FIGS. 19A and 19B are cross-sectional views illustrating a memory device according to another embodiment of the present disclosure, and a method for fabricating the same. FIG. 19A is shown based on a cross section taken along the line A-A' of FIG. 1, and FIG. 19B is shown based on another cross section along the line B-B' of FIG. 1. It will be described focusing on differences from the above-described embodiment.

Referring to FIGS. 19A and 19B, a memory device may include a substrate 400 including a first cell region CA1, a second cell region CA2, a first peripheral circuit region PA1, and a second peripheral circuit region PA2, first lines 420 extending in a first direction over the substrate 400, second lines 450 extending in a second direction over the first lines 420, and memory cells 430 respectively positioned at intersections of the first lines 420 and the second lines 450 between the first lines 420 and the second lines 450. The memory cell 430 may include a multi-layered structure including a lower electrode layer 431, a selection element layer 433, an intermediate electrode layer 435, a variable resistance layer 437, and an upper electrode layer 439.

A first interlayer insulating layer 460 may be interposed between the substrate 400 and the first lines 420 in a vertical direction. The first line 420 may be connected to a portion of the substrate 400 through a first contact plug 410 penetrating the first interlayer insulating layer 460 in the first peripheral circuit region PA1.

Also, in the vertical direction, first, second, and third insulating material layers 472, 476, and 478 may be interposed between the first lines 420 and the second lines 450. The second line 450 may be connected to a portion of the substrate 400 through a second contact plug 440 penetrating the first insulating material layer 472 and the first interlayer insulating layer 460 in the second peripheral circuit region PA2.

Here, the first insulating material layer 472 may be filled between the memory cells 430 in the second direction while being filled between the first lines 420 in the first and second cell regions CA1 and CA2. The second insulating material layer 476 may be filled between the memory cells 430 in the first direction while being filled between the second lines 450 in the second cell region CA2. The third insulating material layer 478 may be filled between the memory cells 430 in the first direction while being filled between the second lines 450 in the first cell region CA1. The k value of the third insulating material layer 478 may be lower than the k value of the first and second insulating material layers 472 and 476.

The formation of the first to third insulating material layers 472, 476, and 478 may be possible by omitting the processes of FIGS. 6A to 7B in the manufacturing method of the embodiment of FIGS. 4A to 11B described above. Alternatively, the formation of the first to third insulating material layers 472, 476, and 478 may be possible by omitting the forming process of the first mask pattern M1 of FIGS. 12A and 12B and the processes of FIGS. 13A to 14B in the manufacturing method of the embodiment of FIGS. 12A to 17B described above.

According to the embodiment of FIGS. 19A and 19B, a low-k material may be interposed between the second lines 450 in the first cell region CA1, and thus, capacitance due to the low-k material may be reduced. For example, a first capacitance defined by a pair of first adjacent portions of the second lines 450 in the first cell region CA1 and a portion of the third insulating material layer 478 disposed between the first adjacent portions of the second lines 450 may be smaller than a second capacitance defined by a pair of second adjacent portions of the second lines 450 in the second cell region CA2 and a portion of the second insulating material layer 476 disposed between the second adjacent portions of the second lines 450.

Figure 20:
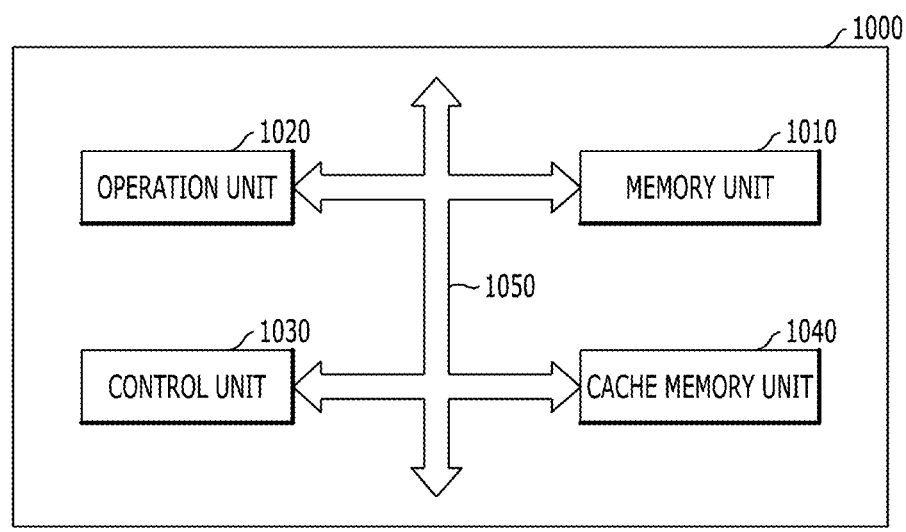
FIG. 20 is an example of configuration diagram of a microprocessor implementing memory circuitry based on the disclosed technology.

FIG. 20 is an example of configuration diagram of a microprocessor implementing memory circuitry based on the disclosed technology.

Referring to FIG. 20, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include various registers such as a data register, an address register, a floating point register and so on. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the embodiments. For example, the memory unit 1010 may include a substrate including a cell region and a peripheral circuit region, the cell region including a first cell region relatively close to the peripheral circuit region and a second cell region relatively far from the peripheral circuit region; a plurality of first lines disposed over the substrate and extending in a first direction; a plurality of second lines disposed over the first lines and extending in a second direction crossing the first direction; a plurality of memory cells positioned at intersections between the first lines and the second lines in the cell region; a first insulating layer positioned between the plurality of first lines, between the plurality of second line, or both, in the first cell region; and a second insulating layer positioned between the plurality of first lines and between the plurality of second lines in the second cell region, wherein a dielectric constant of the first insulating layer is smaller than a dielectric constant of the second insulating layer. Through this, operating characteristics of the memory unit 101 may be improved. As a consequence, it is possible to improve operating characteristics of the microprocessor 1000.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present embodiment may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 21:
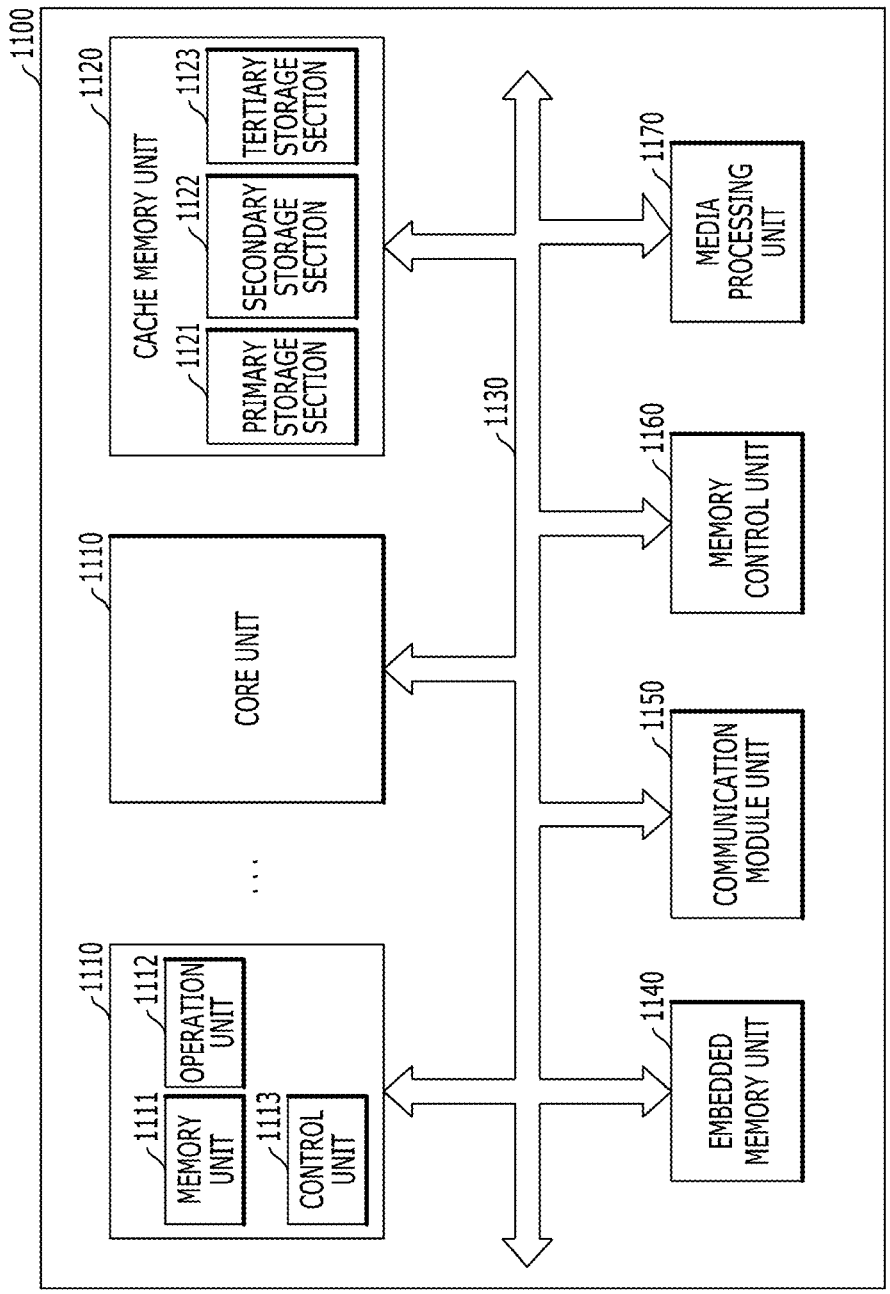
FIG. 21 is an example of configuration diagram of a processor implementing memory circuitry based on the disclosed technology.

FIG. 21 is an example of configuration diagram of a processor implementing memory circuitry based on the disclosed technology.

Referring to FIG. 21, a processor 1100 may improve performance and realize multi-functionality by including various functions other than those of the above-described microprocessor 1000. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present embodiment is a part which performs arithmetic logic operations for data inputted from an external device, and may include a memory unit 1111, an operation unit 1112 and a control unit 1113. The memory unit 1111, the operation unit 1112 and the control unit 1113 may be substantially the same as the memory unit 1010, the operation unit 1020 and the control unit 1030.

The cache memory unit 1120 is a part which temporarily stores data to compensate for a difference in data processing speed between the core unit 1110 operating at a high speed and an external device operating at a low speed. The cache memory unit 1120 may include a primary storage section 1121 and a secondary storage section 1122. Further, the cache memory unit 1120 may include a tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the embodiments. For example, the cache memory unit 1120 may include a substrate including a cell region and a peripheral circuit region, the cell region including a first cell region relatively close to the peripheral circuit region and a second cell region relatively far from the peripheral circuit region; a plurality of first lines disposed over the substrate and extending in a first direction; a plurality of second lines disposed over the first lines and extending in a second direction crossing the first direction; a plurality of memory cells positioned at intersections between the first lines and the second lines in the cell region; a first insulating layer positioned between the plurality of first lines, between the plurality of second line, or both, in the first cell region; and a second insulating layer positioned between the plurality of first lines and between the plurality of second lines in the second cell region, wherein a dielectric constant of the first insulating layer is smaller than a dielectric constant of the second insulating layer. Through this, operating characteristics of the cache memory unit 1120. As a consequence, it is possible to improve operating characteristics of the processor 1100.

Although it was shown in this embodiment that all the primary, secondary and tertiary storage sections 1121, 1122 and 1123 are configured inside the cache memory unit 1120, at least one of the primary, secondary and tertiary storage sections 1121, 1122 and 1123 of the cache memory unit 1120 may be configured outside the core unit 1110 and may compensate for a difference in data processing speed between the core unit 1110 and the external device.

The bus interface 1130 is a part which connects the core unit 1110, the cache memory unit 1120 and external device and allows data to be efficiently transmitted.

The processor 1100 according to the present embodiment may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. Storage sections in each of the core units 1110 may be configured to be shared with storage sections outside the core units 1110 through the bus interface 1130.

The processor 1100 according to the present embodiment may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local region network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra-wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 22:
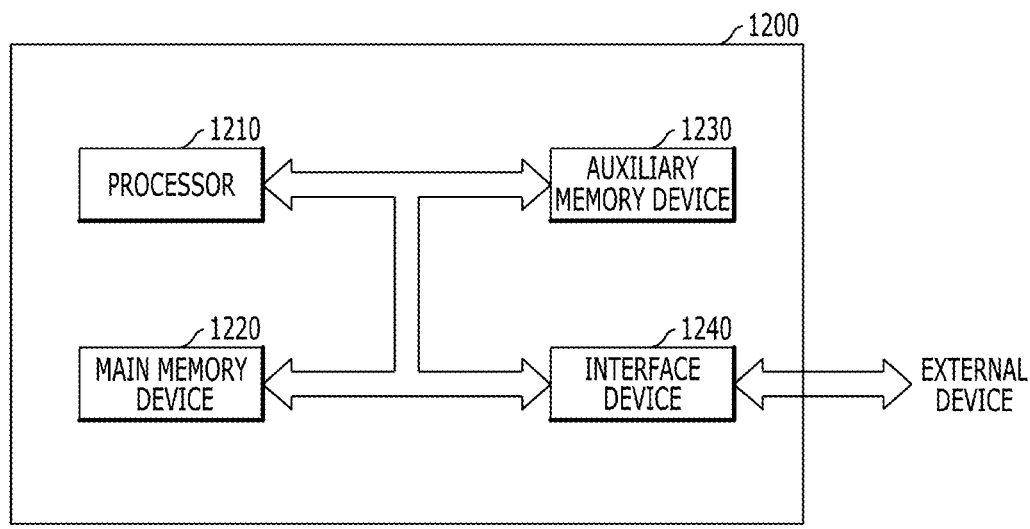
FIG. 22 is an example of configuration diagram of a system implementing memory circuitry based on the disclosed technology.

FIG. 22 is an example of configuration diagram of a system implementing memory circuitry based on the disclosed technology.

Referring to FIG. 22, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present embodiment may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may substantially the same as the above-described microprocessor 1000 or the above-described processor 1100.

The main memory device 1220 is a storage which can temporarily store, call and execute program codes or data from the auxiliary memory device 1230 when programs are executed and can conserve memorized contents even when power supply is cut off. The auxiliary memory device 1230 is a memory device for storing program codes or data. While the speed of the auxiliary memory device 1230 is slower than the main memory device 1220, the auxiliary memory device 1230 can store a larger amount of data. The main memory device 1220 or the auxiliary memory device 1230 may include one or more of the above-described semiconductor devices in accordance with the embodiments. For example, the main memory device 1220 or the auxiliary memory device 1230 may include a substrate including a cell region and a peripheral circuit region, the cell region including a first cell region relatively close to the peripheral circuit region and a second cell region relatively far from the peripheral circuit region; a plurality of first lines disposed over the substrate and extending in a first direction; a plurality of second lines disposed over the first lines and extending in a second direction crossing the first direction; a plurality of memory cells positioned at intersections between the first lines and the second lines in the cell region; a first insulating layer positioned between the plurality of first lines, between the plurality of second line, or both, in the first cell region; and a second insulating layer positioned between the plurality of first lines and between the plurality of second lines in the second cell region, wherein a dielectric constant of the first insulating layer is smaller than a dielectric constant of the second insulating layer. Through this, operating characteristics of the main memory device 1220 or the auxiliary memory device 1230 may be improved. As a consequence, it is possible to improve operating characteristics of the system 1200.

Also, the main memory device 1220 or the auxiliary memory device 1230 may include a memory system (see the reference numeral 1300 of FIG. 23) in addition to the above-described semiconductor device or without including the above-described semiconductor device.

The interface device 1240 may be to perform exchange of commands and data between the system 1200 of the present embodiment and an external device. The interface device 1240 may be a keypad, a keyboard, a mouse, a speaker, a mike, a display, various human interface devices (HIDs), a communication device, and so on. The communication device may be substantially the same as the above-described communication module unit 1150.

Figure 23:
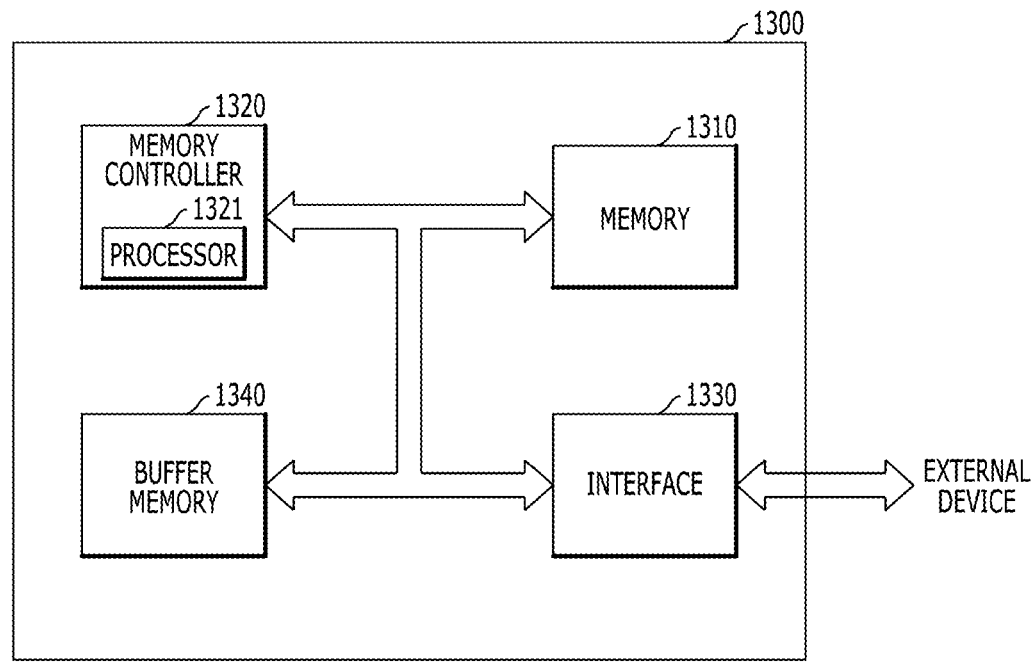
FIG. 23 is an example of configuration diagram of a memory system implementing memory circuitry based on the disclosed technology.

FIG. 23 is an example of configuration diagram of a memory system implementing memory circuitry based on the disclosed technology.

Referring to FIG. 23, a memory system 1300 may include a memory 1310 which has a nonvolatile characteristic as a component for storing data, a controller 1320 which controls the memory 1310, an interface 1330 for connection with an external device, and a buffer memory 1340 for storing data temporarily for efficiently transferring data between the interface 1330 and the memory 1310. The memory system 1300 may simply mean a memory for storing data, and may also mean a data storage device for conserving stored data in a long term. The memory system 1300 may be a disk type such as a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1310 or the buffer memory 1340 may include one or more of the above-described semiconductor devices in accordance with the embodiments. For example, the memory 1310 or the buffer memory 1340 may include a substrate including a cell region and a peripheral circuit region, the cell region including a first cell region relatively close to the peripheral circuit region and a second cell region relatively far from the peripheral circuit region; a plurality of first lines disposed over the substrate and extending in a first direction; a plurality of second lines disposed over the first lines and extending in a second direction crossing the first direction; a plurality of memory cells positioned at intersections between the first lines and the second lines in the cell region; a first insulating layer positioned between the plurality of first lines, between the plurality of second line, or both, in the first cell region; and a second insulating layer positioned between the plurality of first lines and between the plurality of second lines in the second cell region, wherein a dielectric constant of the first insulating layer is smaller than a dielectric constant of the second insulating layer. Through this, operating characteristics of the memory 1310 or the buffer memory 1340 may be improved. As a consequence, it is possible to improve operating characteristics of the memory system 1300.

The memory 1310 or the buffer memory 1340 may include various memories such as a nonvolatile memory or a volatile memory, in addition to the above-described semiconductor device or without including the above-described semiconductor device.

The controller 1320 may control exchange of data between the memory 1310 and the interface 1330. To this end, the controller 1320 may include a processor 1321 for performing an operation for, processing commands inputted through the interface 1330 from an outside of the memory system 1300 and so on.

The interface 1330 is to perform exchange of commands and data between the memory system 1300 and the external device. In the case where the memory system 1300 is a card type or a disk type, the interface 1330 may be compatible with interfaces which are used in devices having a card type or a disk type, or be compatible with interfaces which are used in devices similar to the above mentioned devices. The interface 1330 may be compatible with one or more interfaces having a different type from each other.

Features in the above examples of electronic devices or systems in FIGS. 20-23 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable sub combination. Moreover, although features may be described above as acting in certain combinations and even initially claimed as such, one or more features from a claimed combination can in some cases be excised from the combination, and the claimed combination may be directed to a sub combination or variation of a sub combination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few embodiments and examples are described. Other embodiments, enhancements and variations can be made based on what is described and illustrated in this patent document.

Although various embodiments have been described for illustrative purposes, it will be apparent to those skilled in the art that various changes and modifications may be made without departing from the spirit and scope of the present teachings as defined in the following claims.

What is claimed is:

1. An electronic device comprising a semiconductor memory, the semiconductor memory comprising:
   a substrate including a cell region and a peripheral circuit region, the cell region including a first cell region and a second cell region, the first cell region being disposed closer to the peripheral circuit region than the second cell region;
   a plurality of first lines disposed over the substrate and each extending in a first direction;
   a plurality of second lines disposed over the first lines and each extending in a second direction crossing the first direction;
   a plurality of memory cells positioned at intersections between the first lines and the second lines in the cell region;
   a first insulating layer positioned between the plurality of first lines and the plurality of second lines, in the first cell region; and
   a second insulating layer positioned between the plurality of first lines and the plurality of second lines, in the second cell region,
   wherein a dielectric constant of the first insulating layer is smaller than a dielectric constant of the second insulating layer, and
   wherein only one of the first insulating layer and the second insulating layer is filled between the memory cells.

2. The electronic device according to claim 1, wherein the second insulating layer includes silicon oxide, and
   wherein the first insulating layer includes an insulating material having a dielectric constant lower than a dielectric constant of the silicon oxide.

3. The electronic device according to claim 1, wherein elements constituting the first insulating layer are the same as elements constituting the second insulating layer.

4. The electronic device according to claim 1, wherein the memory cells include a first plurality of memory cells in the first cell region and a second plurality of memory cells in the second cell region, and the first insulating layer is further positioned between the first plurality of memory cells in the first cell region.

5. The electronic device according to claim 1, wherein the memory cells include a first plurality of memory cells in the first cell region and a second plurality of memory cells in the second cell region, and the second insulating layer is further positioned between the second plurality of memory cells in the second cell region.

6. The electronic device according to claim 1, wherein the first insulating layer is positioned between the plurality of first lines in the first cell region, and
wherein the second insulating layer is further positioned between the plurality of second lines in the first cell region.

7. The electronic device according to claim 6, wherein the memory cells include a first plurality of memory cells and a second plurality of memory cells in the first cell region, the first plurality of memory cells and the second plurality of memory cells being arranged in the first direction and the second direction, respectively,
wherein the first insulating layer is further positioned between the second plurality of memory cells in the first cell region in the second direction, and
wherein the second insulating layer is further positioned between the first plurality of memory cells in the first cell region in the first direction.

8. The electronic device according to claim 1, wherein the first insulating layer is positioned between the plurality of second lines in the first cell region, and
wherein the second insulating layer is further positioned between the plurality of first lines in the first cell region.

9. The electronic device according to claim 8, wherein the memory cells include a first plurality of memory cells and a second plurality of memory cells in the first cell region, the first plurality of memory cells and the second plurality of memory cells being arranged in the first direction and the second direction, respectively,
wherein the first insulating layer is further positioned between the first plurality memory cells in the first cell region in the first direction, and
wherein the second insulating layer is further positioned between the second plurality of memory cells in the first cell region in the second direction.

10. The electronic device according to claim 1, wherein the memory cells include a first plurality of memory cells in the first cell region and a second plurality of memory cells in the second cell region, and
wherein an amount of current supplied to the first plurality of memory cells in the first cell region is smaller than an amount of current supplied to the second plurality of memory cells in the second cell region.

11. The electronic device according to claim 1, further comprising a microprocessor which includes:
a control unit configured to receive a signal including a command from an outside of the microprocessor, and performs extracting, decoding of the command, or controlling input or output of a signal of the microprocessor;
an operation unit configured to perform an operation based on a result that the control unit decodes the command; and
a memory unit configured to store data for performing the operation, data corresponding to a result of performing the operation, or an address of data for which the operation is performed,
wherein the semiconductor memory is part of the memory unit in the microprocessor.

12. The electronic device according to claim 1, further comprising a processor which includes:

a core unit configured to perform, based on a command inputted from an outside of the processor, an operation corresponding to the command, by using data;
a cache memory unit configured to store data for performing the operation, data corresponding to a result of performing the operation, or an address of data for which the operation is performed; and
a bus interface connected between the core unit and the cache memory unit, and configured to transmit data between the core unit and the cache memory unit,
wherein the semiconductor memory is part of the cache memory unit in the processor.

13. The electronic device according to claim 1, further comprising a processing system which includes:
a processor configured to decode a command received by the processor and control an operation for information based on a result of decoding the command;
an auxiliary memory device configured to store a program for decoding the command and the information;
a main memory device configured to call and store the program and the information from the auxiliary memory device such that the processor can perform the operation using the program and the information when executing the program; and
an interface device configured to perform communication between at least one of the processor, the auxiliary memory device and the main memory device and the outside,
wherein the semiconductor memory is part of the auxiliary memory device or the main memory device in the processing system.

14. The electronic device according to claim 1, further comprising a memory system which includes:
a memory configured to store data and conserve stored data regardless of power supply;
a memory controller configured to control input and output of data to and from the memory according to a command inputted from an outside;
a buffer memory configured to buffer data exchanged between the memory and the outside; and
an interface configured to perform communication between at least one of the memory, the memory controller and the buffer memory and the outside,
wherein the semiconductor memory is part of the memory or the buffer memory in the memory system.

15. The electronic device according to claim 1, wherein the memory cells include a first memory cell in the first cell region and a second memory cell in the second cell region, only the first insulating layer is applied to the first memory cell, and only the second insulating layer is applied to the second memory cell.

16. An electronic device comprising a semiconductor memory, the semiconductor memory comprising:
a substrate including a cell region and a peripheral circuit region, the cell region including a first cell region and a second cell region, the first cell region being disposed closer to the peripheral circuit region than the second cell region;
a plurality of first lines disposed over the substrate and each extending in a first direction;
a plurality of second lines disposed over the first lines and each extending in a second direction crossing the first direction;
a plurality of memory cells positioned at intersections between the first lines and the second lines in the cell region;

a first insulating layer positioned between the plurality of first lines, between the plurality of second line, or both, in the first cell region; and a second insulating layer positioned between the plurality of first lines and between the plurality of second lines, in the second cell region, wherein, when the first insulating layer is positioned between the plurality of first lines, a first capacitance between first adjacent portions of the plurality of first lines in the first cell region and a first portion of the first insulating layer is smaller than a second capacitance between second adjacent portions of the plurality of first lines in the second cell region and a first portion of the second insulating layer, and wherein, when the first insulating layer is positioned between the plurality of second lines, a third capacitance between first adjacent portions of the plurality of second lines in the first cell region and a second portion of the first insulating layer is smaller than a fourth capacitance between second adjacent portions of the plurality of second lines in the second cell region and a second portion of the second insulating layer.

* * * * *